(12) United States Patent
Lee et al.

(10) Patent No.: US 9,257,508 B2
(45) Date of Patent: Feb. 9, 2016

(54) TRANSISTORS AND METHODS OF MANUFACTURING THE SAME

(75) Inventors: Chang-seung Lee, Yongin-si (KR); Joo-ho Lee, Hwaseong-si (KR); Yong-sung Kim, Namyangju-si (KR); Jun-seong Kim, Yongin-si (KR); Chang-youl Moon, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 344 days.

(21) Appl. No.: 13/595,580

(22) Filed: Aug. 27, 2012

(65) Prior Publication Data

US 2013/0193412 A1  Aug. 1, 2013

(30) Foreign Application Priority Data

Jan. 26, 2012  (KR) .......................... 10-2012-0007798

(51) Int. Cl.

| | |
|---|---|
| *H01L 29/786* | (2006.01) |
| *H01L 29/16* | (2006.01) |
| *H01L 29/66* | (2006.01) |
| *H01L 29/778* | (2006.01) |
| *H01L 21/683* | (2006.01) |
| *H01L 29/417* | (2006.01) |
| *H01L 29/423* | (2006.01) |
| *H01L 29/78* | (2006.01) |

(52) U.S. Cl.
CPC ........ *H01L 29/1606* (2013.01); *H01L 21/6835* (2013.01); *H01L 29/66787* (2013.01); *H01L 29/778* (2013.01); *H01L 29/41758* (2013.01); *H01L 29/41775* (2013.01); *H01L 29/42384* (2013.01); *H01L 29/7831* (2013.01); *H01L 2221/6835* (2013.01); *H01L 2221/68363* (2013.01); *H01L 2221/68381* (2013.01)

(58) Field of Classification Search
CPC .................... H01L 29/78696; H01L 29/1606; H01L 29/66787; H01L 29/66795
See application file for complete search history.

(56) References Cited

U.S. PATENT DOCUMENTS

| | | | |
|---|---|---|---|
| 7,858,989 B2 | 12/2010 | Chen et al. | |
| 2008/0169472 A1* | 7/2008 | Bryant et al. | 257/66 |
| 2009/0020764 A1 | 1/2009 | Anderson et al. | |
| 2010/0200840 A1 | 8/2010 | Anderson et al. | |
| 2010/0295037 A1* | 11/2010 | Hironaka | 257/43 |

(Continued)

FOREIGN PATENT DOCUMENTS

| | | |
|---|---|---|
| JP | 2008-205272 A | 9/2008 |
| JP | 2010021377 A | 1/2010 |
| JP | 2011006265 A | 1/2011 |
| JP | 2011023420 A | 2/2011 |

OTHER PUBLICATIONS

Levendorf et al., "Transfer-Free Batch Fabrication of Single Layer Graphene Transistors," Nano Letters, 2009, pp. 4479-4483, vol. 9, No. 12, American Chemical Society.

European Search Report dated Apr. 15, 2015 on Application No. 13150091.0.

*Primary Examiner* — Yu Chen

(74) *Attorney, Agent, or Firm* — Harness, Dickey & Pierce, P.L.C.

(57) ABSTRACT

Transistors and methods of manufacturing the same may include a gate on a substrate, a channel layer having a three-dimensional (3D) channel region covering at least a portion of a gate, a source electrode over a first region of the channel layer, and a drain electrode over a second region of the channel layer.

41 Claims, 35 Drawing Sheets

(56) References Cited

U.S. PATENT DOCUMENTS

| | | |
|---|---|---|
| 2010/0301336 A1 | 12/2010 | Babich et al. |
| 2010/0320445 A1 | 12/2010 | Ogihara et al. |
| 2011/0089403 A1 | 4/2011 | Woo et al. |
| 2011/0114918 A1 | 5/2011 | Lin et al. |
| 2011/0175060 A1 | 7/2011 | Okai et al. |

* cited by examiner

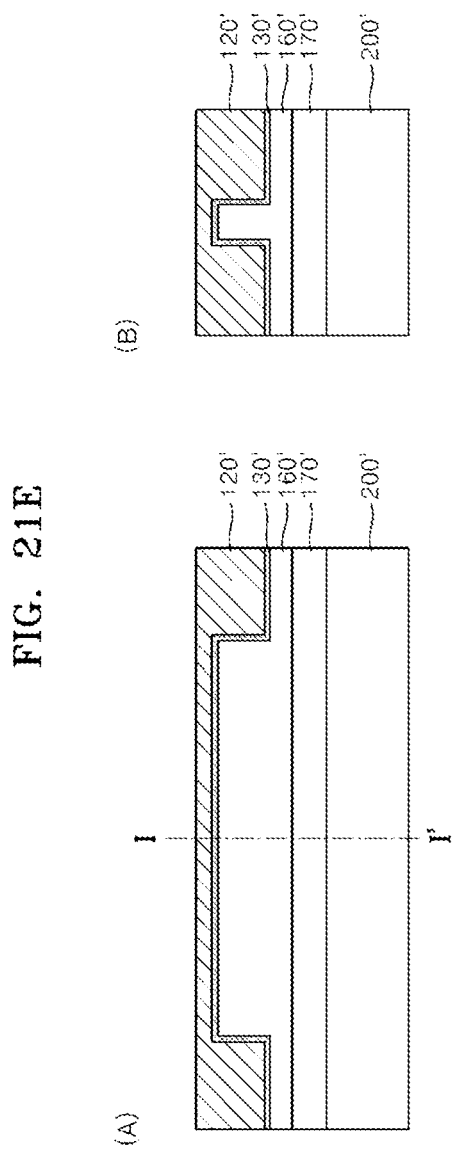

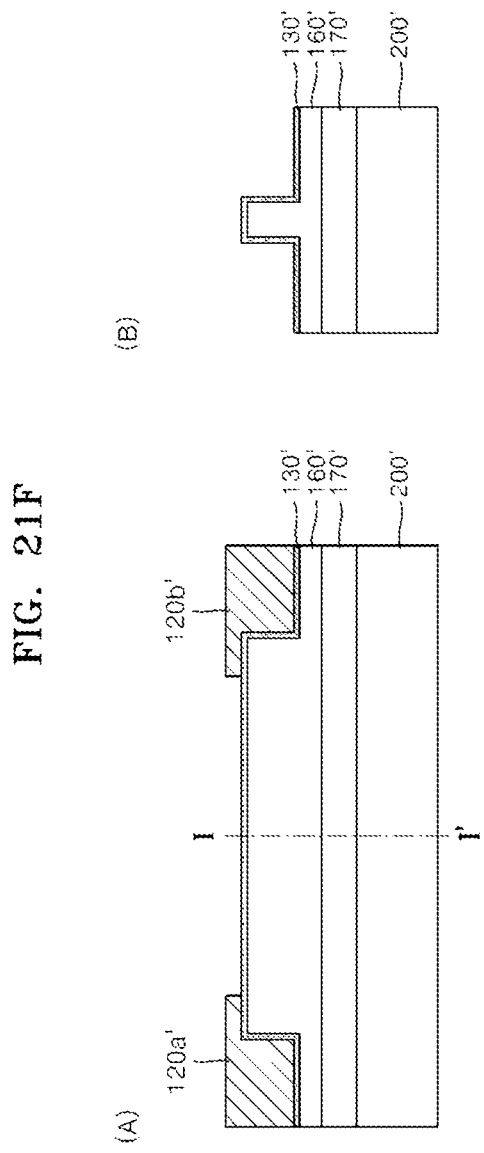

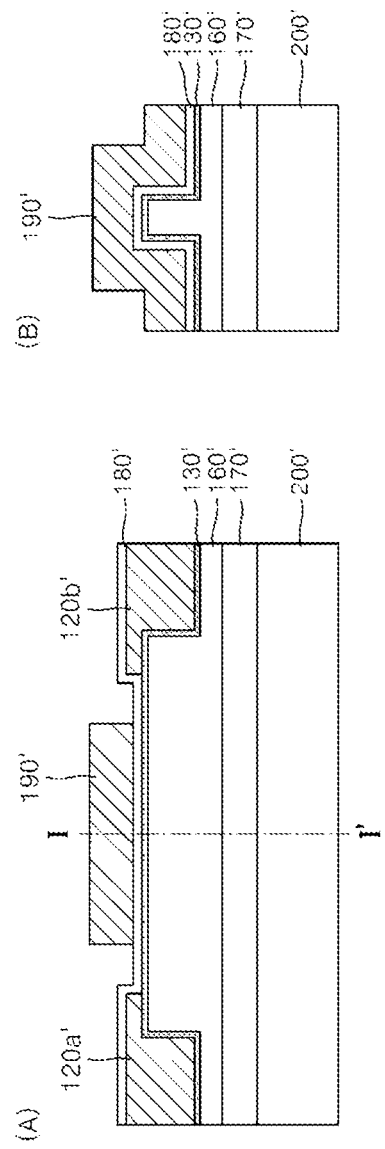

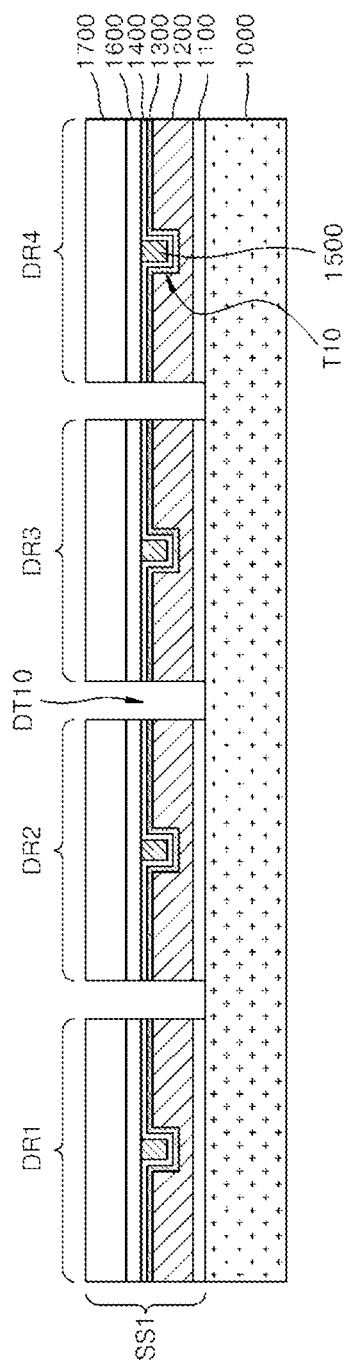

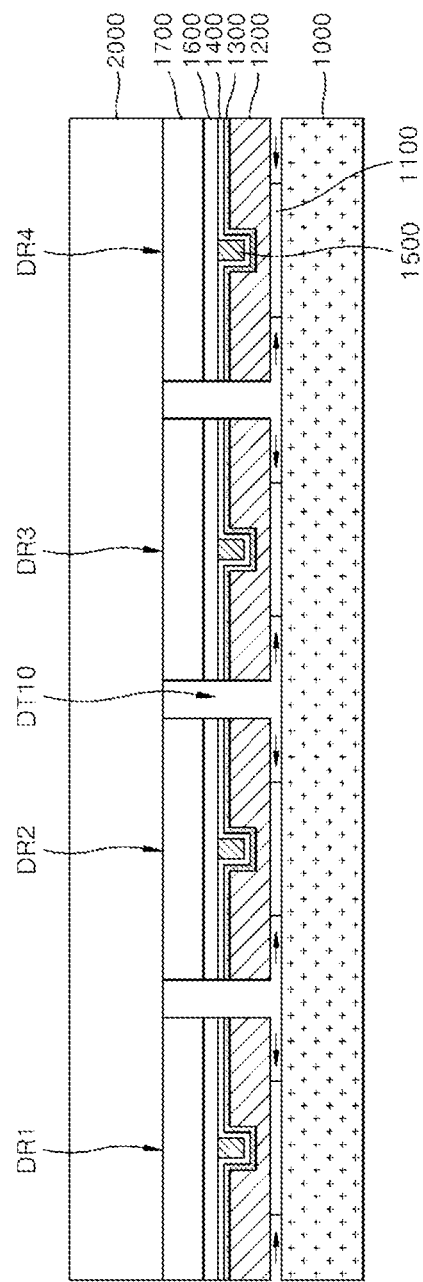

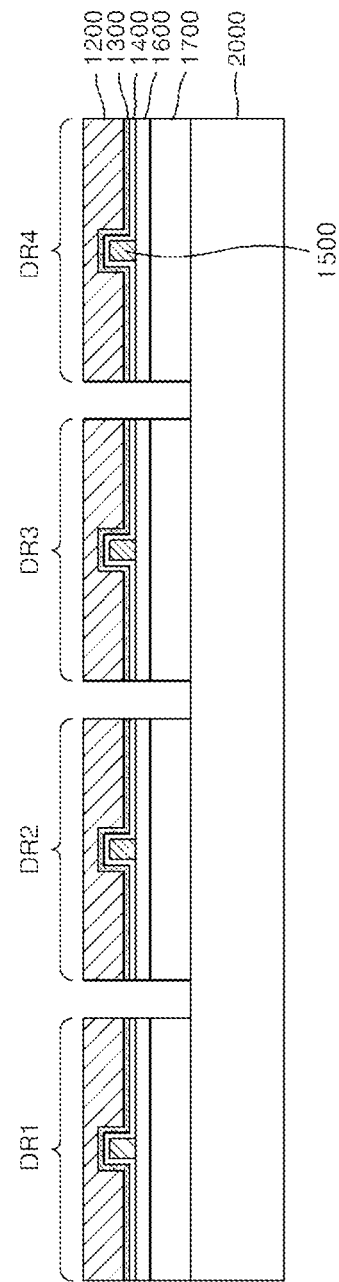

TRANSISTORS AND METHODS OF MANUFACTURING THE SAME

CROSS-REFERENCE TO RELATED APPLICATION

This application claims the benefit of priority from Korean Patent Application No. 10-2012-0007798, filed on Jan. 26, 2012, in the Korean Intellectual Property Office, the disclosure of which is incorporated herein by reference in its entirety.

BACKGROUND

1. Field

Example embodiments relate to transistors and methods of manufacturing the same.

2. Description of the Related Art

Silicon (Si)-based semiconductor devices have been developed to have high integration density and high performance. However, due to limitations in characteristics of Si materials and in manufacturing processes, it is expected to be difficult to implement higher integration and higher capacity Si-based semiconductor devices in the future.

Accordingly, research on next-generation devices that may overcome the limitations of Si-based semiconductor devices has been conducted. For example, attempts have been made to manufacture devices having high performance by using a carbon-based nanostructure (e.g., graphene). Graphene, which is a hexagonal single-layer structure made of carbon atoms, is structurally and chemically stable and has excellent electrical and physical properties. For example, graphene has a carrier mobility of up to about $2 \times 10^5$ cm$^2$/Vs that is faster by about 100 times or more than Si, and a current density of about $10^8$ A/cm$^2$ that is higher by about 100 times or more than copper (Cu). Thus, graphene has drawn attention as a next-generation material that overcomes limitations in general devices.

SUMMARY

Example embodiments relate to transistors and methods of manufacturing the same.

Provided are transistors having a three-dimensional (3D) channel (e.g., a 3D graphene channel) and methods of manufacturing the transistors.

Provided are transistors suitable for increasing integration degree and scaling down and methods of manufacturing the transistors.

Provided are transistors having an effective channel length that may be easily controlled and methods of manufacturing the transistors.

Provided are graphene transistors in which damage or contamination to graphene is prevented or reduced and methods of manufacturing the transistors.

Additional aspects will be set forth in part in the description which follows and, in part, will be apparent from the description, or may be learned by practice of the presented example embodiments.

According to example embodiments, a transistor includes a gate on a substrate, a channel layer having a three-dimensional (3D) channel region covering at least a portion of the gate, a source electrode contacting a first region of the channel layer, and a drain electrode contacting a second region of the channel layer.

The channel layer may be on the substrate and cover both side surfaces and a top surface of the gate.

The channel layer may be on the substrate and may cover both side surfaces and a top surface of the gate. The source electrode may contact the first region of the channel layer, and the drain electrode may contact the second region of the channel layer.

The channel layer may include graphene.

The source electrode and the drain electrode may be respectively at sides of the gate.

The source electrode may include a first source electrode portion that is spaced apart from the 3D channel region, and the drain electrode may include a first drain electrode portion that is spaced apart from the 3D channel region.

Each of the first source electrode portion and the first drain electrode portion may have a height greater than a height of the 3D channel region.

The source electrode may further include a second source electrode portion between the first source electrode portion and the 3D channel region, and the drain electrode may further include a second drain electrode portion between the first drain electrode portion and the 3D channel region.

Each of the second source electrode portion and the second drain electrode portion may have a height equal to, or less than, a height of the 3D channel region.

An effective channel length of the transistor may be adjusted according to a height of each of the second source electrode portion and the second drain electrode portion.

The source electrode may include a first source electrode portion on the channel layer at one side of the gate, and a second source electrode portion connected to the first source electrode portion, the second source electrode portion being on a first side wall of the gate. The drain electrode may include a first drain electrode portion on the channel layer at another side of the gate, and a second drain electrode portion connected to the first drain electrode portion, the second drain electrode portion being on a second side wall of the gate.

The gate may include a first gate and a second gate spaced apart from each other in a horizontal direction, the source electrode may include a first source electrode and a second source electrode spaced apart from each other with the first and second gates therebetween, and the drain electrode may be between the first and second gates.

The first source electrode may include a first primary source electrode portion at one side of the first and second gates, and the second source electrode may include a second primary source electrode portion at another side of the first and second gates.

The first source electrode may further include a first secondary source electrode portion between the first primary source electrode portion and the first gate, and the second source electrode may further include a second secondary source electrode portion between the second primary source electrode portion and the second gate.

The first secondary source electrode portion and the second secondary source electrode portion may each have a height less than a height of each of the first primary source electrode portion and the second primary source electrode portion.

The drain electrode may have a height equal to a height of each of the first secondary source electrode portion and the second secondary source electrode portion.

The gate may be a bottom gate, and wherein the transistor further includes a top gate spaced apart from the bottom gate.

The top gate may cover a region of the channel layer between the source electrode and the drain electrode.

The top gate may have a 3D structure in the region of the channel layer.

The channel layer may be formed of single-layer graphene.

The channel layer may be formed of bilayer graphene.

The transistor may further include an insulating layer on the substrate, the gate being on the insulating layer, wherein the channel layer is on the insulating layer to cover the at least a portion of the gate.

The substrate may be one selected from a polymer substrate, a glass substrate and a silicon substrate.

According to example embodiments, a method of manufacturing a transistor includes forming a stacked structure including a gate and a channel layer having a three-dimensional (3D) channel region covering at least a portion of the gate, forming a source electrode on a first region of the channel layer, and forming a drain electrode on a second region of the channel layer.

The channel layer may cover both side surfaces and a top surface of the gate.

The channel layer may include graphene.

The forming of the stacked structure may include forming a mold layer on a first substrate, the mold layer including a trench, forming the channel layer on the mold layer, the channel layer having a 3D structure due to the trench, forming a gate insulating layer on the channel layer, and forming a gate in the trench.

The forming of the stacked structure may further include attaching a second substrate to the gate and the gate insulating layer, and removing the first substrate.

The channel layer may be formed to include graphene. The mold layer may be a catalyst layer, and the graphene is formed from the catalyst layer.

At least a portion of each of the source electrode and the drain electrode may be formed from the mold layer.

The forming of the source electrode and the drain electrode may include patterning the mold layer.

The forming of the source electrode may include forming a first source electrode portion at one side of the 3D channel region, and the forming of the drain electrode may include forming a first drain electrode portion at another side of the 3D channel region.

The forming of the source electrode may further include forming a second source electrode portion between the first source electrode portion and the 3D channel region, and the forming of the drain electrode may further include forming a second drain electrode portion between the first drain electrode portion and the 3D channel region.

The forming of the second source electrode portion and the second drain electrode portion may include forming a mask pattern on the first source electrode portion, the first drain electrode portion, and the 3D channel region, forming a plurality of conductive layers between the first source electrode portion and the 3D channel region and between the first drain electrode portion and the 3D channel region, and removing the mask pattern.

The forming of the mask pattern may include using backside exposure.

The forming of the source electrode and the drain electrode may include removing the mold layer, forming a mask layer on the channel layer that is formed on the gate, and forming a plurality of conductive layers on the channel layer at both sides of the mask layer.

The forming of the mask layer may include using microcontact printing.

The gate may include a first gate and a second gate spaced apart from each other in a horizontal direction, the source electrode may include a first source electrode and a second source electrode spaced apart from each other with the first and second gates therebetween, and the drain electrode may be formed between the first and second gates.

The gate may be a bottom gate, and wherein the method further includes forming a top gate spaced apart from the bottom gate.

The top gate may cover a region of the channel layer between the source electrode and the drain electrode.

The top gate may have a 3D structure in a region of the channel layer.

The channel layer may be formed of single-layer graphene.

The channel layer may be formed of bilayer graphene.

The forming of the stacked structure may include forming a plurality of device regions, the forming of the mold layer may include forming a plurality of trenches respectively corresponding to the plurality of device regions, and the gate may be formed in each of the plurality of trenches.

The method may further include separating the plurality of device regions by patterning the stacked structure.

The method may further include forming a sacrificial layer between the first substrate and the stacked structure, wherein the removing of the first substrate includes etching the sacrificial layer by injecting an etchant between the plurality of device regions.

According to example embodiments, a method of manufacturing a transistor includes forming a mold layer on a first substrate, the mold layer including a trench, forming a channel layer on at least a portion of the mold layer, the channel layer having a three-dimensional (3D) structure due to the trench, forming an insulating layer on the channel layer, the insulating layer filling the trench, attaching a second substrate to the insulating layer, removing the first substrate, forming a source electrode and a drain electrode respectively contact a first region and a second region of the channel layer, forming an insulating layer on the channel layer, the insulating layer filling the trench, and forming a gate between the source electrode and the drain electrode, the gate being insulated from the channel layer.

The channel layer may cover at least side walls and a bottom surface of the trench. The source electrode and the drain electrode may respectively contact the first region and the second region of the channel layer.

The method may further include forming a gate insulating layer on the channel layer prior to the forming of the gate.

The channel layer may include graphene.

The forming of the mold layer may include using a catalyst material. The graphene may be formed from the catalyst material. The method may further include forming a sacrificial layer between the first substrate and the mold layer, wherein the removing of the first substrate includes etching the sacrificial layer.

At least a portion of each of the source electrode and the drain electrode may be formed from the mold layer.

The gate may have a 3D structure in a region of the channel layer.

BRIEF DESCRIPTION OF THE DRAWINGS

These and/or other aspects will become apparent and more readily appreciated from the following description of the embodiments, taken in conjunction with the accompanying drawings in which:

FIGS. 21A through 21G are cross-sectional views illustrating a method of manufacturing a transistor, according to example embodiments; and FIGS. 22A through 22E are cross-sectional views illustrating a method of manufacturing a transistor, according to example embodiments.

DETAILED DESCRIPTION

Figure 1:
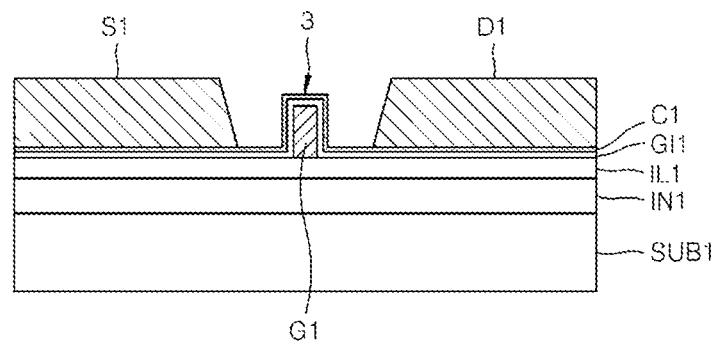
FIG. 1 is a cross-sectional view illustrating a transistor according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments will now be described more fully with reference to the accompanying drawings. Widths and thicknesses of layers or regions illustrated in the drawings may be exaggerated for clarity. The same reference numerals denote the same elements throughout.

Example embodiments relate to transistors and methods of manufacturing the same.

FIG. 1 is a cross-sectional view illustrating a transistor according to example embodiments.

Referring to FIG. 1, an insulating layer IL1 may be disposed on a substrate SUB1. The substrate SUB1 may be a polymer substrate, a glass substrate, or a silicon substrate.

The polymer substrate may be formed of, but not limited to, plastic. The substrate SUB1 may be a flexible substrate or a rigid substrate. The substrate SUB1 may be a transparent substrate or an opaque substrate. The insulating layer IL1 may be formed of an oxide, a nitride, or an oxynitride. An insertion layer IN1 may be disposed between the substrate SUB1 and the insulating layer IL1. The insertion layer IN1 may be formed of an insulating material (e.g., a polymer or a spin-on-glass (SOG) material). The insertion layer IN1 is optional and thus may be omitted.

A gate G1 may be disposed on the insulating layer IL1. The gate G1 may be formed of any of various conductive materials (e.g., a metal and a conductive oxide) used for a general semiconductor device. A gate insulating layer GI1 that covers the gate G1 may be disposed on the insulating layer IL1. The gate insulating layer GI1 may be formed of a silicon (Si) oxide, an Si nitride, an Si oxynitride, a high-k material having a dielectric constant higher than that of an Si nitride (e.g., an aluminium (Al) oxide, a hafnium (Hf) oxide, or a zirconium (Zr) oxide), or an organic material (e.g., a polymer). Alternatively, the gate insulating layer GI1 may have a combination of at least two of the aforementioned materials. A thickness of the gate insulating layer GI1 may range from about 10 nm to about 30 nm, for example. The gate insulating layer GI1 may be conformably formed on the gate G1 and the insulating layer IL1. Accordingly, a shape of the gate G1 protruding from the insulating layer IL1 may be maintained even with the gate insulating layer GI1.

A channel layer C1 may be disposed on the gate insulating layer GI1. The channel layer C1 may be disposed on the gate G1 and the insulating layer IL1 with the gate insulating layer GI1 therebetween. The channel layer C1 may be formed of graphene. For example, the channel layer C1 may be a graphene layer. The channel layer C1 may have a small thickness, for example, a thickness of several to tens of nm. The channel layer C1 may be conformably formed on a top surface of the gate insulating layer GI1. Accordingly, the shape of the gate G1 protruding from the insulating layer IL1 may affect a shape of the channel layer C1. The channel layer C1 may cover both side surfaces and a top surface of the gate G1. The channel layer C1 may have a three-dimensional (3D) structure in a region of the gate G1. In other words, the channel layer C1 may have a 3D structure due to the gate G1. A region of the channel layer C1 corresponding to the gate G1 may be a '3D channel region 3' having a 'П'-shaped cross-section. The 3D channel region 3 may be a central portion of the channel layer C1.

A source electrode S1 may contact a first region of the channel layer C1 and a drain electrode D1 may contact a second region of the channel layer C1. The source electrode S1 and the drain electrode D1 may be disposed at both sides of the gate G1. The source electrode S1 may be spaced apart from one side of the 3D channel region 3, and the drain electrode D1 may be spaced apart from the other side of the 3D channel region 3. Because an electric field of the gate G1 may affect not only the 3D channel region 3 but also portions of the channel layer C1 disposed on both sides of the 3D channel region 3, a region of the channel layer C1 between the source electrode S1 and the drain electrode D1 may be controlled by the electric field of the gate G1, and may act as a 'channel'. If the channel layer C1 is formed of graphene, because an electrical resistance of the channel layer C1 is very low, current flow characteristics between the source electrode S1 and the drain electrode D1 through the channel layer C1 may be excellent.

Each of the source electrode S1 and the drain electrode D1 may be formed of any of various conductive materials used for a general semiconductor device. For example, each of the source electrode S1 and the drain electrode D1 may be formed of at least one of a metal (e.g., nickel (Ni), copper (Cu), cobalt (Co), platinum (Pt), or ruthenium (Ru)) and an alloy thereof. Each of the source electrode S1 and the drain electrode D1 may have a single or multi-layer structure. As shown in FIG. 1, each of the source electrode S1 and the drain electrode D1 may be formed to have a height greater than a height of the 3D channel region 3. However, a height of each of the source electrode S1 and the drain electrode D1 may be reduced by etching an upper portion of each of the source electrode S1 and the drain electrode D1. Accordingly, each of the source electrode S1 and the drain electrode D1 may have a height similar to, or less than, a height of the 3D channel region 3.

Figure 2:
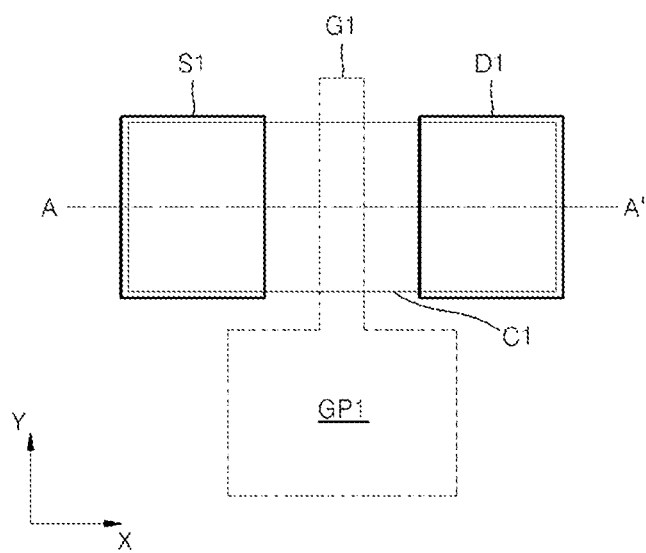
FIG. 2 is a plan view illustrating main elements of the transistor of FIG. 1.

FIG. 2 is a plan view illustrating main elements of the transistor of FIG. 1. FIG. 1 may be a cross-sectional view taken along line A-A' of FIG. 2.

Referring to FIG. 2, the gate G1 has a linear shape extending in a given direction (e.g., a Y-axis direction). A gate pad GP1 may be further disposed on one end of the gate G1. The gate pad GP1 may have a width greater than a width of the gate G1. The gate G1 and the gate pad GP1 may be integrally formed as one body. In this regard, the gate pad GP1 may be regarded as a portion of the gate G1. The channel layer C1 may be disposed to cover at least a portion of the gate G1. The channel layer C1 may extend in a direction perpendicular to the gate G1, for example, in an X-axis direction. The gate G1 may cross a central portion of the channel layer C1. The source electrode S1 may be disposed on the channel layer C1 at one side of the gate G1, and the drain electrode D1 may be disposed on the channel layer C1 at the other side of the gate G1. The source electrode S1 and the drain electrode D1 may be spaced apart from a region of the channel layer C1 corresponding to the gate G1, that is, the 3D channel region 3 of FIG. 1.

The gate G1, the channel layer C1, the source electrode S1, and the drain electrode D1 of FIG. 2 are exemplarily shown, and may have various other shapes. For example, a width of a region of the channel layer C1 between the source electrode S1 and the drain electrode D1 may be less than a width of a region of the channel layer C1 disposed under the source electrode S1 and the drain electrode D1. Each of the source electrode S1 and the drain electrode D1 may extend to the outside of the channel layer C1. The source electrode S1, the drain electrode D1 and the channel layer C1 may have various other shapes.

Figure 3:
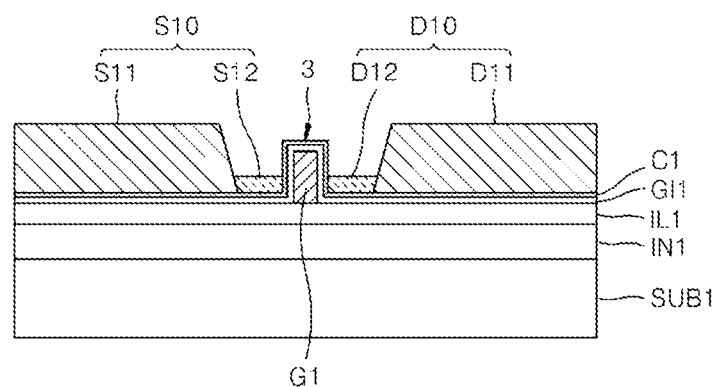
FIGS. 3 and 4 are cross-sectional views illustrating transistors according to example embodiments.

FIG. 3 is a cross-sectional view illustrating a transistor according to example embodiments.

The transistor of FIG. 3 is a modification of the transistor of FIG. 1. The transistor of FIG. 3 is different from the transistor of FIG. 1 in structures of a source electrode S10 and a drain electrode D10.

Referring to FIG. 3, the source electrode S10 may include a first source electrode portion (hereinafter, referred to as a first source portion) S11 and a second source electrode portion (hereinafter, referred to as a second source portion) S12. The drain electrode D10 may include a first drain electrode portion (hereinafter, referred to as a first drain portion) D11 and a second drain electrode portion (hereinafter, referred to as a second drain portion) D12. The first source portion S11 and the first drain portion D11 may be the same as, or similar to, the source electrode S1 and the drain electrode D1 of FIG. 1, respectively. The second source portion S12 may be disposed between the first source portion S11 and the 3D channel region 3. The second drain portion D12 may be disposed between the first drain portion D11 and the 3D channel region 3. The first source portion S11 and the 3D channel region 3 may be connected via the second source portion S12, and the first drain portion D11 and the 3D channel region 3 may be connected via the second drain portion D12. Each of the second source portion S12 and the second drain portion D12 may be formed to have a height less than a height of the 3D channel region 3. A region of a channel layer C11 between the second source portion S12 and the second drain portion D12 may be an 'effective channel region'. A length of the effective channel region (i.e., an effective channel length) may vary according to a height (thickness) of each of the second source portion S12 and the second drain portion D12. Accordingly, the effective channel length may be controlled by adjusting a height (thickness) of each of the second source portion S12 and the second drain portion D12. In FIG. 3, because a height (or, alternatively, a thickness) of each of the second source portion S12 and the second drain portion D12 is easily controlled, the effective channel length may be easily controlled.

Figure 4:
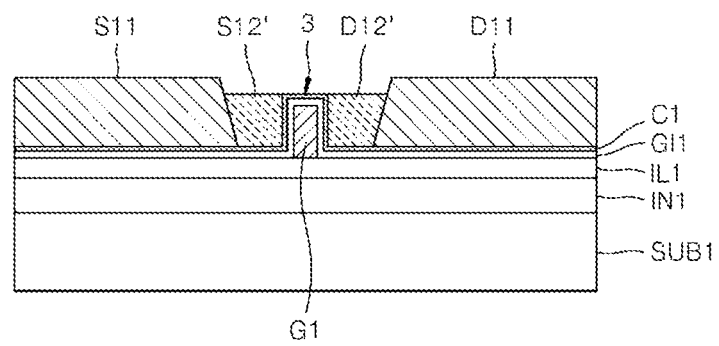

Although each of the second source portion S12 and the second drain portion D12 has a height less than a height of the 3D channel region 3 in FIG. 3, a height of each of the second source portion S12 and the second drain portion D12 may be adjusted to be equal, or similar, to a height of the 3D channel region 3 as shown in FIG. 4.

Referring to FIG. 4, a second source portion S12' and a second drain portion D12' may have a height equal to a height of the 3D channel region 3.

Figure 5:
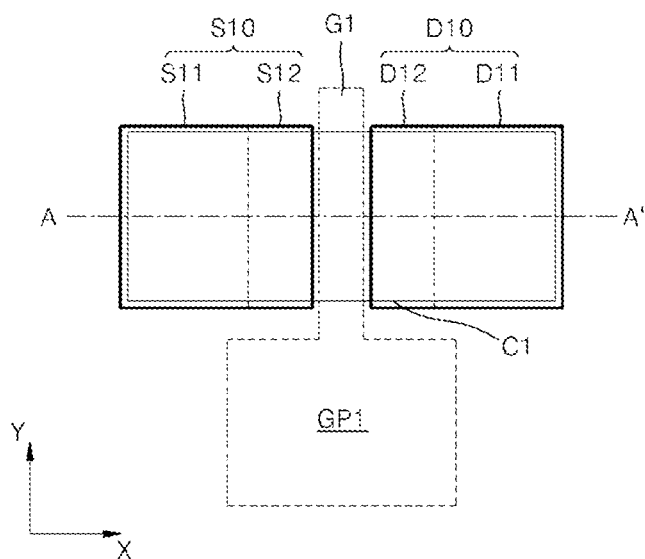
FIG. 5 is a plan view illustrating main elements of the transistor of FIG. 3.

FIG. 5 is a plan view illustrating main elements of the transistor of FIG. 3. FIG. 3 may be a cross-sectional view taken along line A-A' of FIG. 5.

Referring to FIG. 5, the source electrode S10 may be disposed at one side of the gate G1, and may include the first source portion S11 and the second source portion S12. The second source portion S12 may be disposed between the first source portion S11 and the gate G1. The drain electrode D10 may be disposed at the other side of the gate G2, and may include the first drain portion D11 and the second drain portion D12. The second drain portion D12 may be disposed between the first drain portion D11 and the gate G1. Structures of the gate G1 and the channel layer C1 may be the same as those of FIG. 2.

Figure 6:
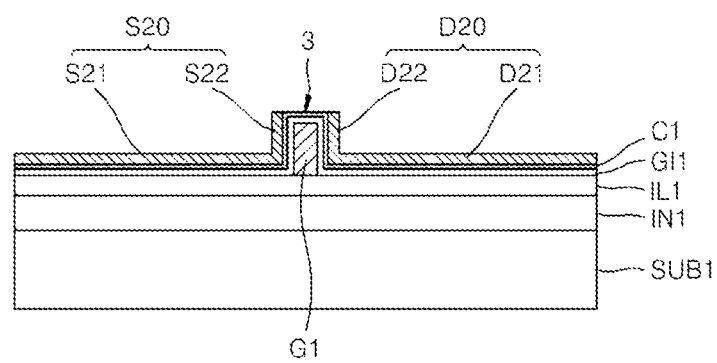
FIG. 6 is a cross-sectional view illustrating a transistor according to example embodiments.

FIG. 6 is a cross-sectional view illustrating a transistor according to example embodiments.

The transistor of FIG. 6 is a modification of the transistor of FIG. 1. The transistor of FIG. 6 is different from the transistor of FIG. 1 in structures of a source electrode S20 and a drain electrode D20.

Referring to FIG. 6, the source electrode S20 and the drain electrode D20 may be disposed at both sides of the gate G1. The source electrode S20 may include a first source electrode portion (hereinafter, referred to as a first source portion) S21 and a second source electrode portion (hereinafter, referred to as a second source portion) S22. The first source portion S21 may be disposed on the channel layer C1 at one side of the gate G1, and the second source portion S22 may be connected to the first source portion S21 and may be disposed on a first side wall of the gate G1. Likewise, the drain electrode D20 may include a first drain electrode portion (hereinafter, referred to as a first drain portion) D21 and a second drain electrode portion (hereinafter, referred to as a second drain portion) D22. The first drain portion D21 may be disposed on the channel layer C1 at the other side of the gate G1, and the second drain portion D22 may be connected to the first drain portion D21 and may be disposed on a second side wall of the gate G1. The first source portion S21 and the second source portion S22 may have similar thicknesses, and the first drain portion D21 and the second drain portion D22 may have similar thicknesses. If necessary, a height of each of the second source portion S22 and the second drain portion D22 may be adjusted. An effective channel length may vary according to heights of the second source portion S22 and the second drain portion D22. The second source portion S22 and the second drain portion D22 are optional and thus may be omitted.

Figure 7:
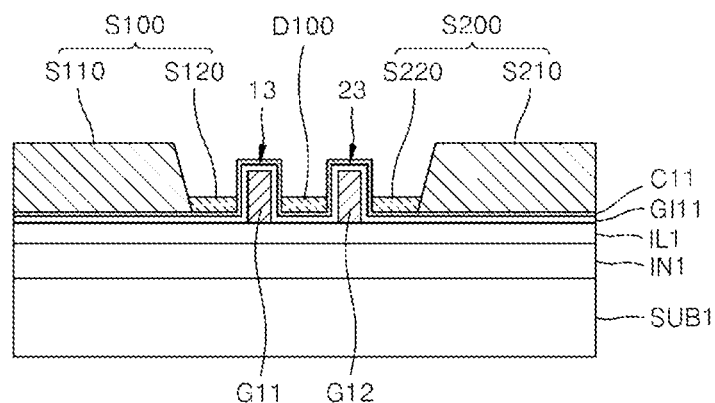
FIG. 7 is a cross-sectional view illustrating a transistor according to example embodiments.

FIG. 7 is a cross-sectional view illustrating a transistor according to example embodiments.

The transistor of FIG. 7 is a modification of the transistor of FIG. 3. The transistor of FIG. 7 may include a plurality of gates (e.g., first and second gates G11 and G12), which are spaced apart from each other in a horizontal direction.

Referring to FIG. 7, the insulating layer IL1 may be disposed on the substrate SUB1. The insertion layer IN1 may be disposed between the substrate SUB1 and the insulating layer IL1. The first and second gates G11 and G12 may be disposed on the insulating layer IL1. The first and second gates G11 and G12 may be horizontally spaced apart from each other. A channel layer C11 may be disposed to cover at least a portion of each of the first and second gates G11 and G12. The channel layer C11 may include a first 3D channel region 13 corresponding to the first gate G11 and a second 3D channel region 23 corresponding to the second gate G12. A gate insulating layer GI11 may be disposed between the channel layer C11 and the first and second gates G11 and G12. The gate insulating layer GI11 may extend between the channel layer C11 and the insulating layer IL1. A first source electrode S100 and a second source electrode S200 may contact different regions of the channel layer C11. The first source electrode S100 and the second source electrode S200 may be spaced apart from each other with the first and second gates G11 and G12 therebetween. That is, the first source electrode S100 may be disposed at one side of the first and second gates G11 and G12, and the second source electrode S200 may be disposed at the other side of the first and second gates G11 and G12. The first source electrode S100 may be disposed adjacent to the first gate G11, and the second source electrode S200 may be disposed adjacent to the second gate G12. Accordingly, the first gate G11 may be disposed between the first source electrode S100 and the second gate G12, and the second gate G12 may be disposed between the second source electrode S200 and the first gate G11. The first source electrode S100 may include a first source electrode portion (hereinafter, referred to as a 1-1 source portion) S110 and a second source electrode portion (hereinafter, referred to as a 1-2 source portion) S120. The 1-2 source portion S120 may be disposed between the 1-1 source portion S110 and the first 3D channel region 13. The second source electrode S200 may include a first source electrode portion (hereinafter, referred to as a 2-1 source portion) S210 and a second source electrode portion (hereinafter, referred to as a 2-2 source portion) S220. The 2-2 source portion S220 may be disposed between the 2-1 source portion S210 and the second 3D channel region 23. The 1-1 source portion S110 and the 2-1 source portion S210 may be similar to the first source portion S11 of FIG. 3, and the 1-2 source portion S120 and the 2-2 source portion S220 may be similar to the second source portion S12 of FIG. 3. A drain electrode D100 may be disposed between the first 3D channel region 13 and the second 3D channel region 23. The drain electrode D100 may be a 'common drain electrode' commonly used with respect to the first and second source electrodes S100 and S200. The drain electrode D100 may have a height equal, or similar, to that of each of the 1-2 source portion S120 and the 2-2 source portion S220. An effective channel length of the first 3D channel region 13 may be controlled according to a height of each of the 1-2 source portion S120 and the drain electrode D100. Likewise, an effective channel length of the second 3D channel region 23 may be controlled according to a height of each of the 2-2 source portion S220 and the drain electrode D100.

Figure 8:
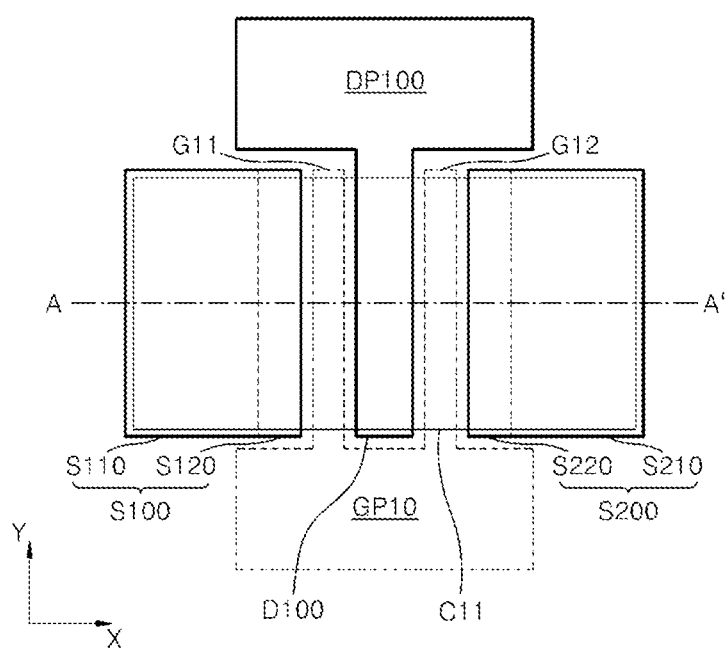
FIG. 8 is a plan view illustrating main elements of the transistor of FIG. 7.

FIG. 8 is a plan view illustrating main elements of the transistor of FIG. 7. FIG. 7 may be a cross-sectional view taken along line A-A' of FIG. 8.

Referring to FIG. 8, the first and second gates G11 and G12 may be spaced apart from each other. The first and second gates G11 and G12 may have linear shapes extending in a given direction (e.g., a Y-axis direction), and may be spaced apart from each other in an X-axis direction. A gate pad GP10 commonly connected to the first and second gates G11 and G12 may be disposed on one ends of the first and second gates G11 and G12. The gate pad GP10 and the first and second gates G11 and G12 may be integrally formed as one body. The channel layer C11 may be disposed to cover at least a portion of each of the first and second gates G11 and G12. The channel layer C11 may be, for example, a graphene layer. The first source electrode S100 may be disposed on the channel layer C11 at one side of the first and second gates G11 and G12, and the second source electrode S200 may be disposed on the channel layer C11 at the other side of the first and second gates G11 and G12. The first source electrode S100 may include the 1-1 source portion S110 and the 1-2 source portion S120, and the second source electrode S200 may include the 2-1 source portion S210 and the 2-2 source portion S220. The 1-2 source portion S120 may be disposed between the 1-1 source portion S110 and the first gate G11, and the 2-2 source portion S220 may be disposed between the 2-1 source portion S210 and the second gate G12. The drain electrode D100 may be disposed between the first and second gates G11 and G12. The drain electrode D100 may have a linear shape that extends in a direction parallel to the first and second gates G11 and G12 (i.e., in the Y-axis direction). A drain pad DP100 may be disposed on an end of the drain electrode D100. The drain electrode D100 and the drain pad DP100 may be integrally formed as one body, but example embodiments are not limited thereto. The drain pad DP100 may be regarded as a portion of the drain electrode D100. The drain pad DP100 may be formed to have a height equal, or similar, to a height of each of the 1-1 source portion S110 and the 2-1 source portion S210. The drain pad DP100 may be formed of a material that is the same as or similar to a material of each of the 1-1 source portion S110 and the 2-1 first source portion S210. However, if necessary, the drain pad DP100 may be formed to have a height and/or a material different from a height and/or a material of each of the 1-1 source portion S110 and the 2-1 source portion S210. For example, the drain pad DP100 may be formed to have the same material and/or the same height as a material and/or a height of the drain electrode D100. The elements of FIG. 8 are exemplarily shown, and may have various other shapes.

The transistor according to example embodiments includes the channel layer C1 or C11 having a 3D structure. The channel layer C1 or C11 having the 3D structure may be a graphene layer. Hence, the transistor may be a "3D graphene channel transistor". The channel layer C1 or C11 having the 3D structure may ensure a sufficient effective channel length more easily than a channel layer having a two-dimensional (2D) structure (i.e., a planar structure). That is, when a transistor including a channel layer having a 2D structure is scaled down, it is difficult to ensure a sufficient channel length. However, even when a transistor including the channel layer C1 or C11 having the 3D structure is scaled down, a sufficient effective channel length may be ensured. Accordingly, the transistor according to example embodiments may be suitable for increasing integration degree and scaling down of a device.

In FIG. 3, because an effective channel length is easily controlled by adjusting a height (or, alternatively, thickness) of each of the second source portion S12 and the second drain portion D12, characteristics of the transistor may be easily controlled. Likewise in FIG. 3, an effective channel length of the transistor of FIG. 7 may be easily controlled.

Also, in FIG. 3, the second source portion S12 and the second drain portion D12 may be self-aligned. It is related to a method of forming the second source portion S12 and the second drain portion D12, which will be explained later in detail. Because the second source portion S12 and the second drain portion D12 are self-aligned, misalignment problems may be prevented (or reduced). Also, because the second source portion S12 and the second drain portion D12 are self-aligned, an interval between the gate G1 and the second source portion S12 and an interval between the gate G1 and the second drain portion D12 may be reduced, and thus a resistance between the second source portion S12 and the second drain portion D12 may be reduced. Accordingly, operating characteristics of the transistor may be improved. Because the 1-2 source portion S120, the 2-2 source portion S220, and the drain electrode D100 of FIG. 7 may also be self-aligned, misalignment problems may be prevented (or, alternatively, reduced) and characteristics of the transistor of FIG. 7 may be improved. The source electrode S20 and the drain electrode D20 of FIG. 6 may also be self-aligned.

Figure 9A:
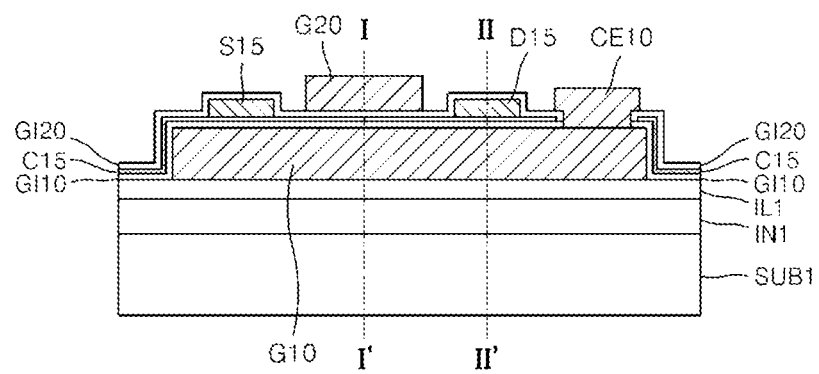
FIGS. 9A through 9C are cross-sectional views illustrating a transistor according to example embodiments.
Figure 9B:
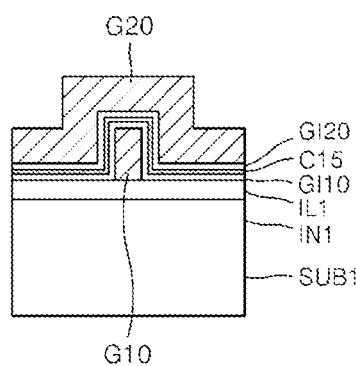
Figure 9C:
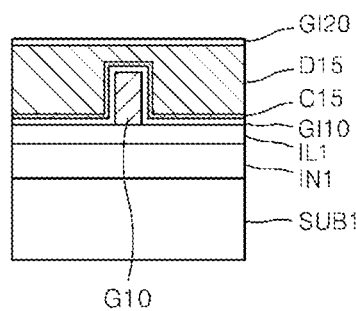

FIGS. 9A through 9C are cross-sectional views illustrating a transistor according to example embodiments. FIG. 9B is a cross-sectional view taken along line I-I' of FIG. 9A. FIG. 9C is a cross-sectional view taken along line II-II' of FIG. 9A.

The transistor of FIGS. 9A through 9C may have a double gate structure including a bottom gate G10 and a top gate G20.

Referring to FIG. 9A, an insertion layer IN1 and an insulating layer IL1 may be sequentially disposed on a substrate SUB1, and a bottom gate G10 may be disposed on the insulating layer IL1. A first gate insulating layer GI10 that covers the bottom gate G10 may be disposed on the insulating layer IL1. A channel layer C15 may be disposed on the first gate insulating layer GI10. The channel layer C15 may be formed to include graphene. For example, the channel layer C15 may be a graphene layer. The channel layer C15 may have a 3D structure due to the bottom gate G10. The 3D structure of the channel layer C15 may be explained in FIG. 9B below. A source electrode S15 may contact a first region of the channel layer C15, and a drain electrode D15 may contact a second region of the channel layer C15. A second gate insulating layer GI20 that covers the source electrode S15 and the drain electrode D15 may be disposed on the channel layer C15. A top gate G20 may be disposed on the second gate insulating layer GI20. The top gate G20 may be disposed between the source electrode S15 and the drain electrode D15. A first contact electrode CE10 that contacts the bottom gate G10 may be further disposed on the second gate insulating layer GI20. The first contact electrode CE10 may contact the bottom gate G10 through a contact hole that passes through the second gate insulating layer GI20, the channel layer C15, and the first gate insulating layer GI10. The channel layer C15 may not be exposed at an inner wall of the contact hole. That is, a portion of the channel layer C15 in the contact hole may be covered by the first and second gate insulating layers GI10 and GI20. Accordingly, the channel layer C15 and the first contact electrode CE10 may be electrically isolated from each other. The first contact electrode CE10 may be disposed at one side of the drain electrode D15, but example embodiments are not limited thereto and the first contact electrode CE10 may be formed at another position. A region of the bottom gate G10 where the first contact electrode CE10 is formed may be a pad region.

FIG. 9B may be a cross-sectional view taken along line I-I' of FIG. 9A.

Referring to FIG. 9B, the channel layer C15 may have a 3D structure due to the bottom gate G10, and the top gate G20 disposed on the channel layer C15 may have a 3D structure. The top gate G20 may have a 3D structure in a region of the channel layer C15.

FIG. 9C may be a cross-sectional view taken along line II-II' of FIG. 9A.

Referring to FIG. 9C, the drain electrode D15 may contact the channel layer C15 formed to have a 3D structure due to the bottom gate G10. The second gate insulating layer GI20 may be disposed on the drain electrode D15.

Figure 10:
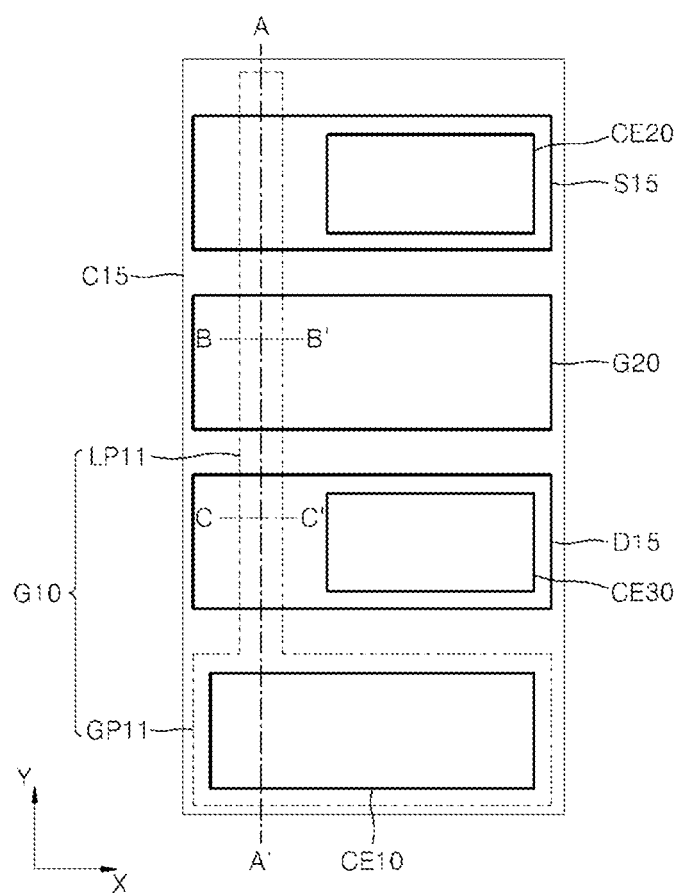
FIG. 10 is a plan view illustrating main elements of the transistor of FIGS. 9A through 9C.

FIG. 10 is a plan view illustrating main elements of the transistor of FIGS. 9A through 9C. FIG. 9A may be a cross-sectional view taken along line A-A' of FIG. 10. FIG. 9B may be a cross-sectional view taken along line B-B' of FIG. 10. FIG. 9C may be a cross-sectional view taken along line C-C' of FIG. 10.

Referring to FIG. 10, the bottom gate G10 may include a line pattern portion LP11 that extends in a given direction (e.g., a Y-axis direction), and may further include a bottom gate pad GP11 that is disposed on one end of the line pattern portion LP11. The bottom gate pad GP11 may have a width greater than a width of the line pattern portion LP11. The channel layer C15 may be formed to entirely cover the bottom gate G10. The source electrode S15 may overlap with a first region of the line pattern portion LP11. The drain electrode D15 may have a structure that overlaps with a second region of the line pattern portion LP11. The top gate G20 may be disposed between the source electrode S15 and the drain electrode D15. The first contact electrode CE10 may contact the bottom gate pad GP11. Likewise, a second contact electrode CE20 and a third contact electrode CE30 may respectively contact the source electrode S15 and the drain electrode D15. The elements of FIG. 10 are exemplarily shown and may have various other shapes.

In FIG. 9A, the channel layer C15 may be formed of single-layer graphene, however, example embodiments are not limited thereto. The channel layer C15 may be formed of bilayer graphene.

Figure 11:
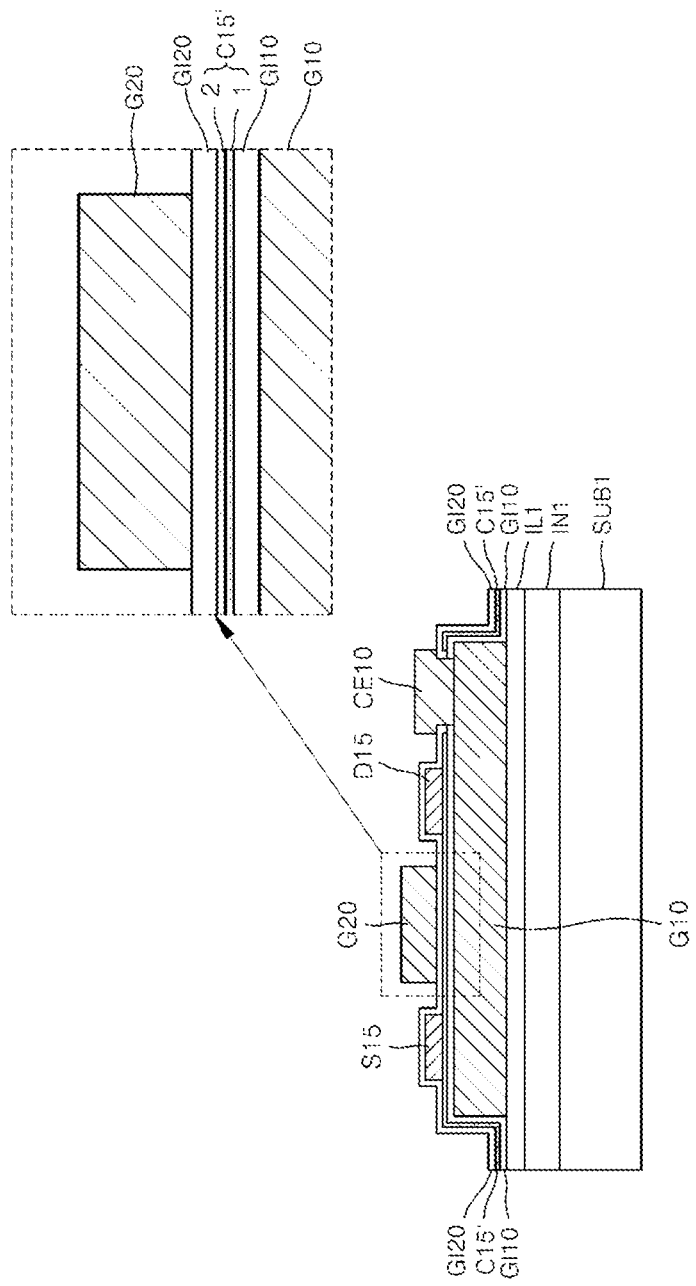
FIG. 11 is a cross-sectional view illustrating a transistor according to example embodiments.

FIG. 11 illustrates a case where the channel layer C15 is formed of bilayer graphene.

Referring to FIG. 11, a channel layer C15' may include first graphene 1 and second graphene 2. The first graphene 1 and the second graphene 2 may constitute a bilayer graphene. As such, when the channel layer C15' is formed of the bilayer graphene, because a bandgap of the channel layer C15' may be greater than a bandgap of a channel layer formed of single-layer graphene, an on/off current ratio of the transistor including the channel layer C15' formed of the bilayer graphene may be increased.

Figure 12A:
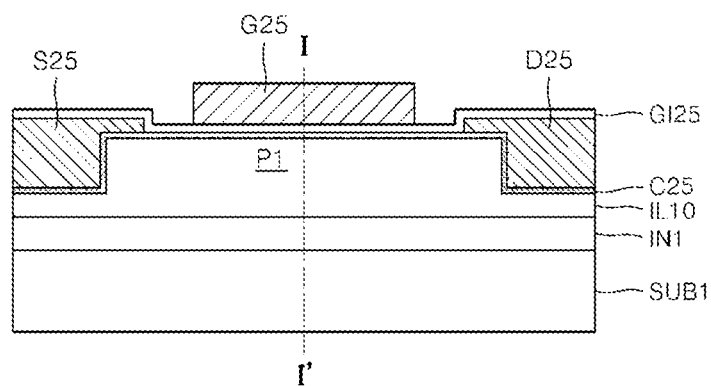
FIGS. 12A and 12B are cross-sectional views illustrating a transistor according to example embodiments.
Figure 12B:
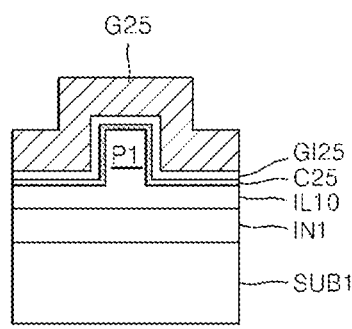

FIGS. 12A and 12B are cross-sectional views illustrating a transistor according to example embodiments. FIG. 12B is a cross-sectional view taken along line I-I' of FIG. 12A.

Referring to FIG. 12A, an insulating layer IL10 may be disposed on a substrate SUB1. An insertion layer IN1 may be disposed between the substrate SUB1 and the insulating layer IL10. A region of the insulating layer IL10 may protrude upward than other regions of the insulating layer IL10. That is, the insulating layer IL10 may include a protrusion P1 that protrudes upward. A channel layer C25 that covers the protrusion P1 may be disposed on the insulating layer IL10. The channel layer C25 may be formed to include graphene. For example, the channel layer C25 may be a graphene layer. A source electrode S25 and a drain electrode D25 may respectively contact first and second regions of the channel layer C25. The source electrode S25 may be disposed to overlap with one end of the protrusion P1, and the drain electrode D25 may be disposed to overlap with the other end of the protrusion P1. A gate insulating layer G125 that covers the source electrode S25 and the drain electrode D25 may be disposed on the channel layer C25. A gate G25 may be disposed on the gate insulating layer G125. The gate G25 may be disposed between the source electrode S25 and the drain electrode D25.

FIG. 12B may be a cross-sectional view taken along line I-I' of FIG. 12A.

Referring to FIG. 12B, the channel layer C25 may have a 3D structure due to the protrusion P1. The gate G25 may have a 3D structure in a region of the channel layer C25.

Figure 13:
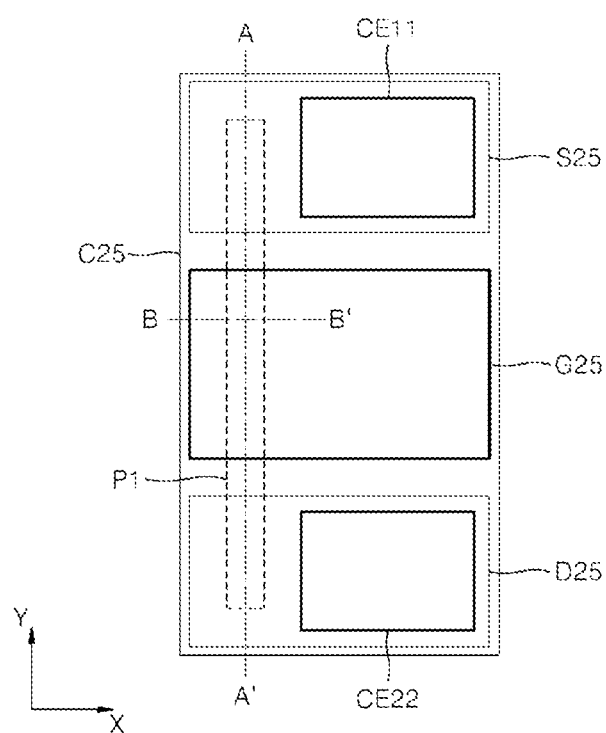
FIG. 13 is a plan view illustrating main elements of the transistor of FIGS. 12A and 12B.

FIG. 13 is a plan view illustrating main elements of the transistor of FIGS. 12A and 12B. FIG. 12A may be a cross-sectional view taken along line A-A' of FIG. 13, and FIG. 12B may be a cross-sectional view taken along line B-B' of FIG. 13.

Referring to FIG. 13, the protrusion P1 may have a linear shape that extends in a given direction (e.g., a Y-axis direction). The channel layer C25 may be disposed to cover the protrusion P1. The source electrode S25 may contact a first region of the channel layer C25 that corresponds to one end of the protrusion P1. The drain electrode D25 may contact a second region of the channel layer C25 that corresponds to the other end of the protrusion P1. The gate G25 may be disposed to overlap with the protrusion P1 between the source electrode S25 and the drain electrode D25. A first contact electrode CE11 may contact the source electrode S25 and a second contact electrode CE22 may contact the drain electrode D25.

FIGS. 14A through 14G are cross-sectional views illustrating a method of manufacturing a transistor according to example embodiments.

Figure 14A:
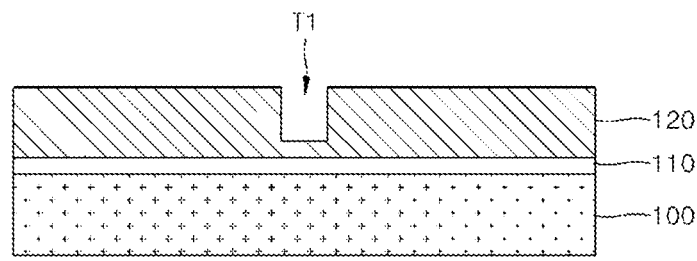
FIGS. 14A through 14G are cross-sectional views illustrating a method of manufacturing a transistor, according to example embodiments.

Referring to FIG. 14A, a mold layer 120 including a trench T1 may be formed on a first substrate 100. The first substrate 100 may be, for example, a silicon substrate. Before forming of the mold layer 120, an intermediate layer 110 may be formed on the first substrate 100 and then the mold layer 120 may be formed on the intermediate layer 110. The intermediate layer 110 may prevent a reaction, for example, a silicide reaction, between the first substrate 100 and the mold layer 120. Also, the intermediate layer 110 may prevent diffusion of a material between the first substrate 100 and the mold layer 120. The intermediate layer 110 may be an insulating layer (e.g., a silicon oxide layer). If the first substrate 100 is a silicon substrate, a silicon oxide layer used as the intermediate layer 110 may be formed by oxidizing a top surface of the first substrate 100. A thickness of the intermediate layer 110 may range from about 100 nm to about 300 nm. A material of the intermediate layer 110 and a method of forming the intermediate layer 110 are not limited to those described above, and may be variously changed. For example, the intermediate layer 110 may be formed of a nitride, and may be formed by using a method other than oxidation. If necessary, the intermediate layer 110 may not be formed.

The mold layer 120 may be formed of a catalyst material for forming graphene. In this regard, the mold layer 120 may be a catalyst layer. For example, the mold layer 120 may be formed of at least one of a metal (e.g., nickel (Ni), copper (Cu), cobalt (Co), platinum (Pt), or ruthenium (Ru)) and a combination thereof. The mold layer 120 may have a single layer, or multi-layer, structure. The mold layer 120 may be formed by using any of various methods (e.g., plating, evaporation, sputtering, chemical vapor deposition (CVD), and atomic layer deposition (ALD)). The mold layer 120 may be formed to a thickness ranging from about 100 nm to about 500 nm.

The trench T1 may be formed by using any of various methods. For example, the trench T1 may be formed by using an etching process. That is, after a mold material layer having a uniform thickness is formed, the trench T1 may be formed by etching a portion of the mold material layer to a desired depth. A depth of the trench T1 may be less than a thickness of the mold layer 120. Accordingly, a portion of the mold layer 120 having a desired thickness may remain under the trench T1. If necessary, an additional catalyst layer (not shown) may be further formed on the mold layer 120 including the trench T1. The additional catalyst layer may be conformably formed to a relatively small thickness. By forming the additional catalyst layer, a size (e.g., a width or a depth) of the trench T1 may be adjusted, and a portion damaged due to the etching may not be exposed.

The mold layer 120 including the trench T1 may be formed by using a method other than the etching. For example, the mold layer 120 including the trench T1 may be formed by using a lift-off method. In detail, after a first catalyst layer having a desired thickness is formed on the intermediate layer 110, a mask pattern (e.g., a photoresist) corresponding to a region of the trench T1 may be formed on the first catalyst layer, and then a second catalyst layer may be formed on the first catalyst layer around the mask pattern. In this case, a material of the second catalyst layer may also be formed on the mask pattern. Next, the mask pattern may be removed. When the mask pattern is removed, the material of the second catalyst layer formed on the mask pattern may also be removed. A structure including the first catalyst layer and the second catalyst layer formed on the first catalyst layer may be the mold layer 120 including the trench T1 of FIG. 14A.

Figure 14B:
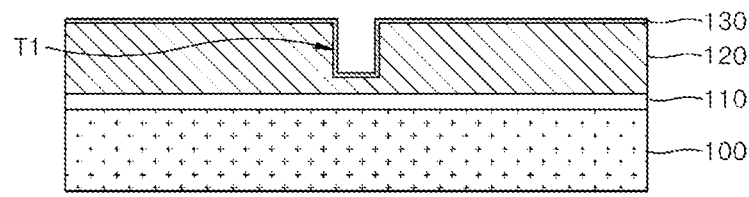

Referring to FIG. 14B, a channel layer 130 may be formed on the mold layer 120. The channel layer 130 may be conformably formed on a top surface of the mold layer 120. The channel layer 130 may have a 3D structure due to the trench T1. A material of the channel layer 130 may be graphene. In this case, the mold layer 120 may be a catalyst layer for growing graphene. That is, a graphene layer may be grown on the mold layer 120 by using the mold layer 120 as a catalyst layer, and the graphene layer may be used as the channel layer 130. The graphene layer may be formed by using CVD or pyrolysis. If the graphene layer is formed by using CVD, a source gas including carbon is supplied to the mold layer 120 (i.e., a catalyst layer). Examples of the source gas may include $CH_4$, $C_2H_2$, $C_2H_4$, CO, or the like. In order to form the graphene layer, a high-temperature process of about 700° C. to about 1100° C. may be required. Accordingly, the first substrate 100 needs to be formed of a material that may withstand the high-temperature process. In this regard, the first substrate 100 may be a silicon substrate. However, as long as it may withstand the high-temperature process, any substrate may be used as the first substrate 100. For example, a quartz substrate may be used as the first substrate 100. If necessary, a SiC substrate may be used as the first substrate 100. If the SiC substrate is used as the first substrate 100, after a trench is formed in the SiC substrate, a graphene layer may be directly formed on the SiC substrate including the trench. That is, a graphene layer may be formed by using an SiC substrate as a mold layer without an additional catalyst layer. Although a case wherein the channel layer 130 is a graphene layer is mainly described in the current example embodiments, a material of the channel layer 130 may be changed, if necessary.

Figure 14C:
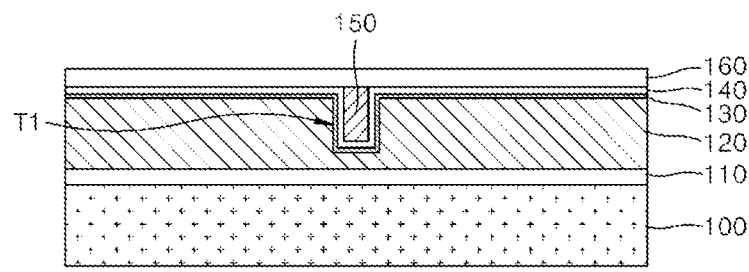

Referring to FIG. 14C, a gate insulating layer 140 may be formed on the channel layer 130. The gate insulating layer 140 may be conformably formed on a top surface of the channel layer 130. The gate insulating layer 140 may be formed of an Si oxide, an Si nitride, an Si oxynitride, a high-k material having a dielectric constant higher than that of an Si nitride (e.g., an Al oxide, an Hf oxide, or a Zr oxide), or an organic material (e.g., a polymer). Alternatively, the gate insulating layer 140 may be formed of a combination of at least two of the aforementioned materials. The gate insulating layer 140 may be formed by using thermal ALD, thermal CVD, or evaporation. When the gate insulating layer 140 is formed, a process temperature may be equal to, or lower than, about 400° C., but may be higher than 400° C., if necessary. A thickness of the gate insulating layer 140 may range from about 10 nm to about 30 nm, for example.

Next, a gate 150 may be formed in the trench T1. The gate 150 may be formed of a conductive material (e.g., a metal or a conductive oxide) used for a general semiconductor device. After a gate material layer is formed on an entire surface of the gate insulating layer 140, the gate 150 may be formed by removing portions of the gate material layer other than a portion of the gate material layer disposed in the trench T1. Alternatively, after a mask layer through which the trench T1 is exposed is formed on the gate insulating layer 140, the gate 150 may be formed by depositing a gate material layer only in the trench T1. The gate 150 may be formed by using various other methods. A position of the gate 150 may be automatically determined by the trench T1.

Figure 14D:
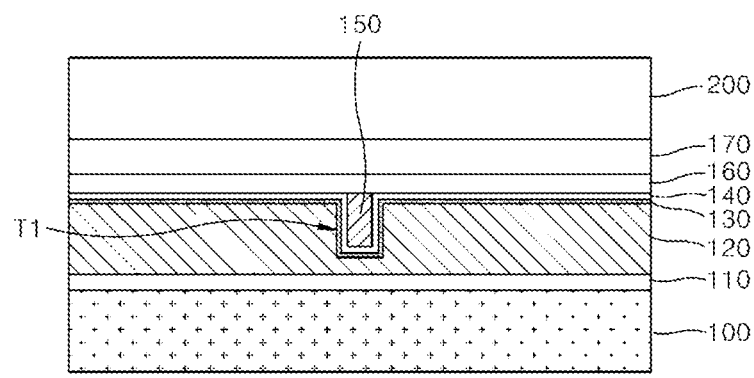

Referring to FIG. 14D, an insulating layer 160 may be formed on the gate insulating layer 140 and the gate 150. The insulating layer 160 may be formed of an oxide, a nitride, or an oxynitride. An insertion layer 170 may be formed on the insulating layer 160. The insertion layer 170 may be formed of an insulating material (e.g., a polymer or an SOG material). The insertion layer 170 may be formed by using, for example, spin coating. The insertion layer 170 may be formed to have a flat surface. If the insertion layer 170 does not have a flat surface, a process of planarizing a surface of the insertion layer 170 may be additionally performed. The insertion layer 170 may be formed in order to easily attach a second substrate 200 in a subsequent process. Also, if the insertion layer 170 is formed, the strength of a structure of FIG. 14D may be increased. However, the insertion layer 170 is optional and thus may be omitted.

Next, a second substrate 200 may be attached to the insertion layer 170. The second substrate 200 may correspond to the substrate SUB1 of FIG. 1. The second substrate 200 may be attached to the gate insulating layer 140 and the gate 150 with the insulating layer 160 and the insertion layer 170 therebetween. The second substrate 200 may be, for example, a polymer substrate, a glass substrate, or a silicon substrate. The polymer substrate may be formed of, but not limited to, plastic. If the second substrate 200 includes a polymer, the second substrate 200 may be an adhesive tape. However, a material of the second substrate 200 is not limited thereto, and may be variously changed. That is, the second substrate 200 may be formed of a material other than a polymer, glass, and silicon. If necessary, an adhesive layer (not shown) may be further disposed between the insertion layer 170 and the second substrate 200. The second substrate 200 may prevent the channel layer 130 from being folded or wrinkled in a process of separating the first substrate 100 and a subsequent process. That is, the second substrate 200 may act as a support portion. According to circumstances, the insertion layer 170 may act as a supporting element instead of the second substrate 200. In this case, the insertion layer 170 may be regarded as a substrate and the second substrate 200 may be omitted.

Figure 14E:
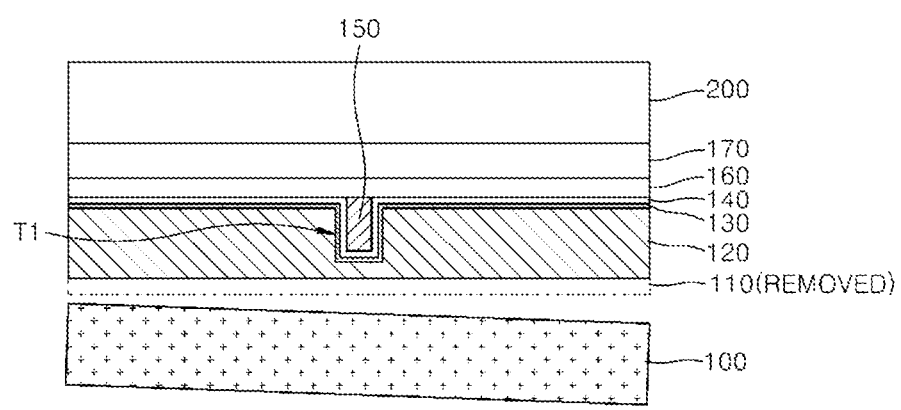

Referring to FIG. 14E, the first substrate 100 may be removed or separated. A method of removing the first substrate 100 may be variously performed. For example, the first substrate 100 may be removed or separated by etching the intermediate layer 110. In order to etch the intermediate layer 110, an etchant including, for example, hydrofluoric acid (HF), may be used. A process of removing or separating the first substrate 100 is not limited thereto and may vary. For example, after the first substrate 100 is mostly removed by using a polishing process, a remaining portion of the first substrate 100 may be removed by using an etchant and then the intermediate layer 110 may be removed. Examples of the etchant used to remove the remaining portion of the first substrate 100 may include potassium hydroxide (KOH) and tetramethylammonium hydroxide (TMAH).

Figure 14F:
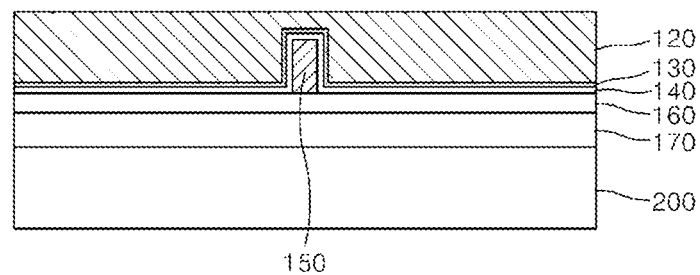

Referring to FIG. 14F, the second substrate 200 on which the mold layer 120, the channel layer 130, the gate insulating layer 140, and the gate 150 are formed may be overturned.

Figure 14G:
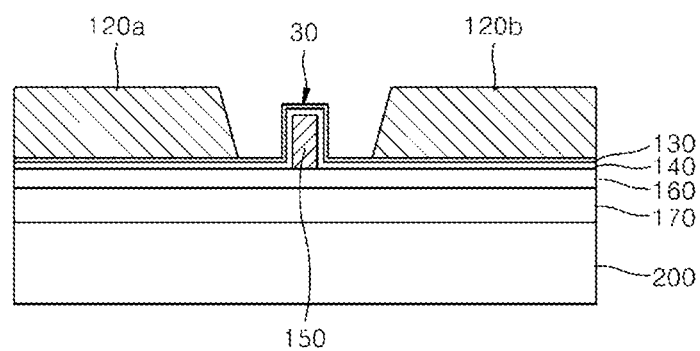

Referring to FIG. 14G, a source electrode portion 120*a* and a drain electrode portion 120*b* may be formed by partially etching the mold layer 120. Because the mold layer 120 may be a conductive layer (e.g., a metal layer), the source electrode portion 120*a* and the drain electrode portion 120*b* may be formed from the mold layer 120. The source electrode portion 120*a* may be formed on the channel layer 130 at one side of the gate 150 and the drain electrode portion 120*b* may be formed on the channel layer 130 at the other side of the gate 150. Each of the source electrode portion 120*a* and the drain electrode portion 120*b* may have a height greater than a height of a region of the channel layer 130 corresponding to the gate 150 (i.e., a 3D channel region 30).

A method of forming the source electrode portion 120*a* and the drain electrode portion 120*b* will be explained in more detail. After a first mask pattern (not shown) is formed on the mold layer 120 of FIG. 14F, the mold layer 120 and the channel layer 130 may be sequentially patterned by using the first mask pattern as an etch barrier. In this manner, a shape of the channel layer 130 may be defined as similar to the channel layer C1 of FIG. 2. In this case, the mold layer 120 may be patterned to have the same shape as that of the channel layer 130. Next, the first mask pattern may be removed, and a second mask pattern (not shown) may be formed on the mold layer 120. The second mask pattern may have an opening through which an upper region of the gate 150 and a region of the mold layer 120 around the gate 150 are exposed. The source electrode portion 120*a* and the drain electrode portion 120*b* may be formed as shown in FIG. 14G by etching the mold layer 120 by using the second mask pattern as an etch barrier. The source electrode portion 120*a* and the drain electrode portion 120B may have the same shapes as, or similar shapes to, those of the source electrode S1 and the drain electrode D1 of FIG. 2. Accordingly, the transistor of FIG. 14G may have the same planar structure as or a similar planar structure to that of FIG. 2.

The method of FIGS. 14A through 14G may be variously changed. For example, the first substrate 100 may be removed or separated by etching the mold layer 120 instead of the intermediate layer 110 in FIG. 14E. In this case, because the mold layer 120 is removed, the source electrode portion 120*a* and the drain electrode portion 120*b* may not be formed from the mold layer 120. Accordingly, after an additional conductive layer is deposited, a source electrode and a drain electrode similar to the source electrode portion 120*a* and the drain electrode portion 120*b* may be formed by patterning the additional conductive layer.

In FIGS. 14A through 14G, the transistor is manufactured by forming the channel layer 130 having a 3D structure due to the trench T1 on the first substrate 100, forming the gate 150 in the trench T1, attaching the second substrate 200 to the gate 150, removing the first substrate 100, and performing a remaining process on the channel layer 130 on the second substrate 200. In this case, the channel layer 130 may be a graphene layer. The method may reduce the possibility of damage to or contamination of the channel layer 130 (i.e., a graphene layer). In the related art, graphene is grown on a first substrate, and the graphene is separated from the first substrate and is transferred to another substrate. Thus, the graphene may be cracked or wrinkled, and be exposed to various contaminants so that quality of the graphene may be easily degraded. However, in the method according to example embodiments, after a graphene layer (i.e., the channel layer 130) is formed on the first substrate 100, the second substrate 200 is attached to the graphene layer (i.e., the channel layer 130) and then the first substrate 100 is separated or removed to transfer the graphene layer (that is, the channel layer 130) Therefore, the graphene layer (i.e., the channel layer 130) may be prevented from being cracked or wrinkled. Furthermore, because the graphene layer (i.e., the channel layer 130) protected by other layers (e.g., the mold layer 120 and the gate insulating layer 140) is transferred to the second substrate 200, the possibility that the graphene layer (that is, the channel layer 130) is damaged or contaminated while being transferred may be greatly reduced. Accordingly, a high performance device including high quality graphene may be manufactured.

Also, because the source electrode 120*a* and the drain electrode 120*b* may be formed from the mold layer 120, a manufacturing process may be simplified and manufacturing costs may be reduced. Also, because a position of the gate 150 on the 3D channel region 30 may be self-aligned, misalignment problems may be prevented.

In addition, because various substrates may be used as the second substrate 200 that is a final substrate, usability of the device may be increased, and the application field thereof may be broadened. For example, if a flexible substrate is used as the second substrate 200, the transistor according to example embodiments may be applied to a flexible display. If a transparent substrate (e.g., a glass substrate) is used as the second substrate 200, the transistor may be applied to a transparent display. Also, the transistor may be applied to a high frequency device (e.g., a radio frequency (RF) device), as well as a display.

FIGS. 15A through 15E are cross-sectional views illustrating a method of manufacturing a transistor according to example embodiments.

Figure 15A:
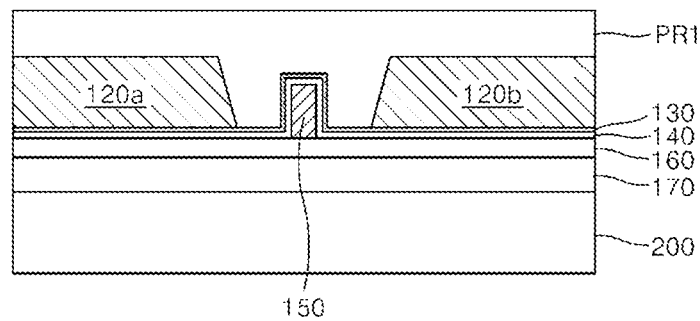
FIGS. 15A through 15E are cross-sectional views illustrating a method of manufacturing a transistor, according to example embodiments.

Referring to FIG. 15A, a photosensitive film PR1 may be formed on a structure of FIG. 14G. That is, the photosensitive film PR1 may be formed to cover the source electrode portion 120*a*, the drain electrode portion 120*b*, and the channel layer 130 disposed between the source electrode portion 120*a* and the drain electrode portion 120*b* of FIG. 14G.

Figure 15B:
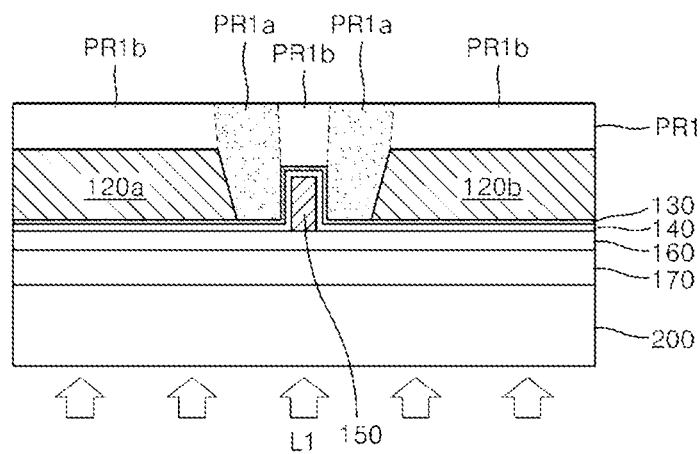

Referring to FIG. 15B, a backside exposure process may be performed with respect to the photosensitive film PR1. That is, light L1 may be emitted from a bottom surface of the second substrate 200 to the photosensitive film PR1. The light L1 may be ultraviolet rays, for example. Because the light L1 may not transmit through the source electrode portion 120*a*, the drain electrode portion 120*b*, and the gate 150, the source electrode portion 120*a*, the drain electrode portion 120*b*, and the gate 150 may act as exposure masks. Accordingly, only a portion of the photosensitive film PR1 not covered by the source electrode portion 120a, the drain electrode portion 120b, and the gate 150 is selectively exposed and characteristics of the exposed portion may be changed. For example, the exposed portion of the photosensitive film PR1 may be changed to a soluble region PR1a. A portion of the photosensitive film PR1 covered by the source electrode portion 120a, the drain electrode portion 120b, and the gate 150 may be an insoluble region PR1b.

Figure 15C:
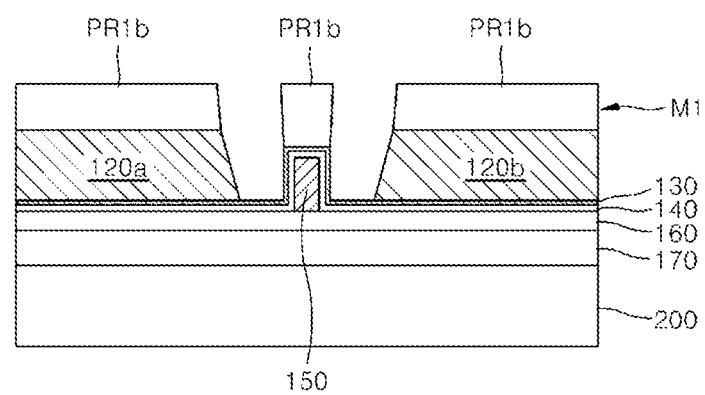

Next, the photosensitive film PR1 may be developed by using a developer. In this case, only the soluble region PR1a may be selectively removed and the insoluble region PR1b may remain. A resultant structure of the developing process is illustrated in FIG. 15C. The insoluble region PR1B disposed on the source electrode portion 120a, the drain electrode portion 120b, and the gate 150 of FIG. 15C may be referred to as a mask pattern M1. The mask pattern M1 may be formed by using a method other than the backside exposure. Also, the mask pattern M1 may be formed of a material other than a photosensitive material.

Figure 15D:
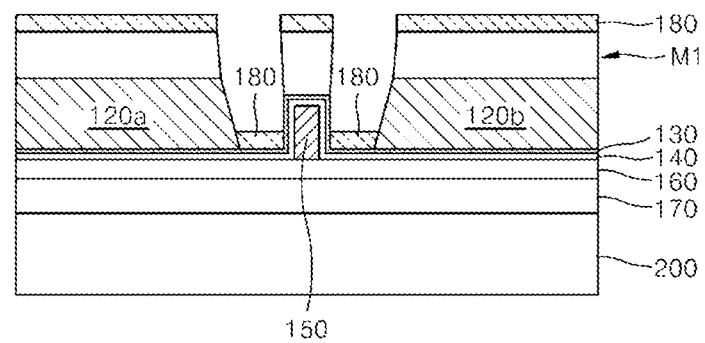

Referring to FIG. 15D, a conductive layer 180 may be deposited on the mask pattern M1 and the channel layer 130. The conductive layer 180 may be formed on a region not covered by the mask pattern M1 (i.e., a region of the channel layer 130 between the source electrode portion 120a and the gate 150, and a region of the channel layer 130 between the drain electrode portion 120b and the gate 150). The conductive layer 180 may also be formed on the mask pattern M1.

Next, the mask pattern M1 may be removed. In this case, a portion of the conductive layer 180 formed on the mask pattern M1 may also be removed. A resultant structure obtained after removing the mask pattern M1 and the conductive layer 180 formed on the mask pattern M1 of FIG. 15D is illustrated in FIG. 15E.

Figure 15E:
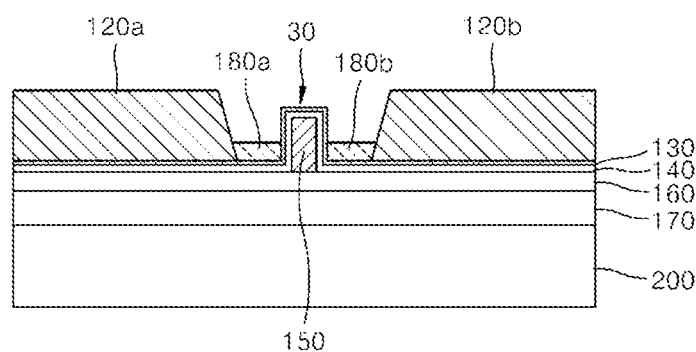

Referring to FIG. 15E, a portion of the conductive layer 180 formed between the source electrode portion (hereinafter, referred to as a first source electrode portion) 120a and the gate 150 may be referred to as a second source electrode portion 180a, and a portion of the conductive layer 180 formed between the drain electrode portion (hereinafter, referred to as a first drain electrode portion) 120b and the gate 150 may be referred to as a second drain electrode portion 180b. The first source electrode portion (hereinafter, referred to as a first source portion) 120a and the second source electrode portion (hereinafter, referred to as a second source portion) 180a may constitute one 'source electrode', and the first drain electrode portion (hereinafter, referred to as a first drain portion) 120b and the second drain electrode portion (hereinafter, referred to as a second drain portion) 180b may constitute one 'drain electrode'. The first source portion 120a and the second source portion 180a may respectively correspond to the first source portion S11 and the second source portion S12 of FIG. 3, and the first drain portion 120b and the second drain portion 180b may respectively correspond to the first drain portion D11 and the second drain portion D12 of FIG. 3. A height of each of the second source portion 180a and the second drain portion 180b may be easily adjusted. That is, a height of each of the second source portion 180a and the second drain portion 180b may be easily controlled by controlling a thickness of the conductive layer 180 in FIG. 15D. Each of the second source portion 180a and the second drain portion 180b may be formed to have a height equal, or similar, to a height of the 3D channel region 30. Accordingly, a structure similar to that of FIG. 4 may be obtained.

In FIGS. 15A through 15E, the second source portion 180a and the second drain portion 180b may be self-aligned. In other words, positions of the second source portion 180a and the second drain portion 180b may be self-aligned with respect to the gate 150. Accordingly, misalignment problems may be prevented, or suppressed. Also, due to the self-alignment, a resistance between the second source portion 180a and the second drain portion 180b may be reduced, and operating characteristics of the transistor may be improved. Also, an effective channel length of the transistor may be easily adjusted by controlling a height (or, alternatively, thickness) of each of the second source portion 180a and the second drain portion 180b.

FIGS. 16A through 16E are cross-sectional views illustrating a method of manufacturing a transistor according to example embodiments.

Figure 16A:
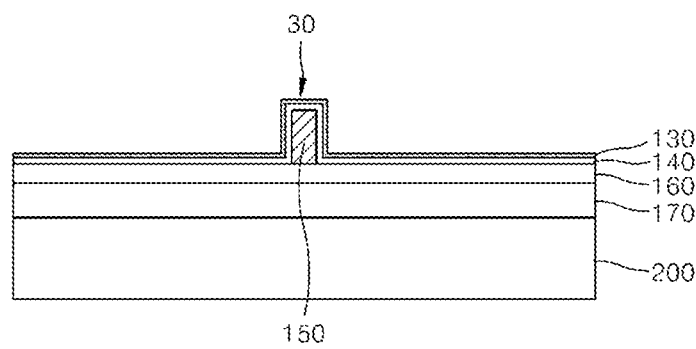
FIGS. 16A through 16E are cross-sectional views illustrating a method of manufacturing a transistor, according to example embodiments.

Referring to FIG. 16A, a structure similar to the structure of FIG. 14G may be prepared. The structure of FIG. 16A may correspond to the structure of FIG. 14G, excluding the source electrode portion 120a and the drain electrode portion 120b.

Figure 16B:
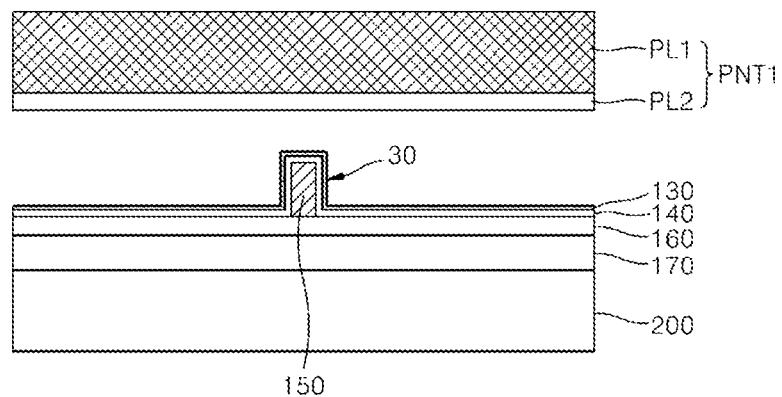

Referring to FIG. 16B, a printing member PNT1 may be disposed above the channel layer 130. The printing member PNT1 may include a support layer PL1 and a self-assembled monolayer (SAM) PL2 disposed on a bottom surface of the support layer PL1.

Figure 16C:
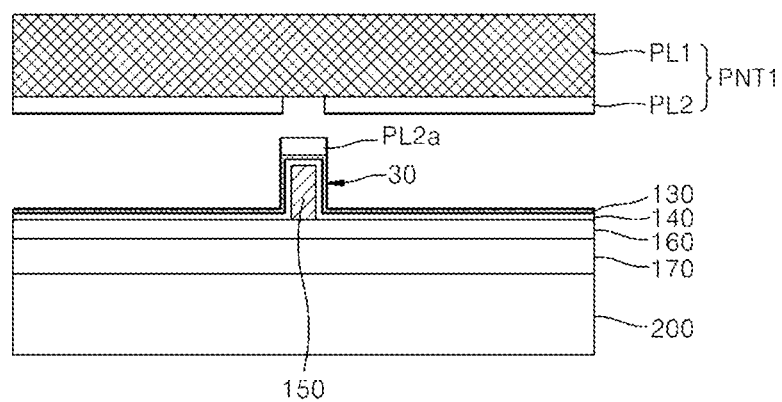

Referring to FIG. 16C, after the printing member PNT1 and the channel layer 130 are brought into contact with each other, the printing member PNT1 and the channel layer 130 may be separated from each other. In this case, a protrusion of the channel layer 130 (i.e., a top surface of the 3D channel region 30) may contact the SAM PL2 of the printing member PNT1. As a result, a portion PL2a of the SAM PL2 may be attached to the top surface of the 3D channel region 30. The portion PL2a of the SAM PL2 attached to the top surface of the 3D channel region 30 may act as a 'mask'. As such, in example embodiments, a mask (i.e., the portion PL2a) may be formed on the 3D channel region 30 by using a micro-contact printing method. The mask may be formed by using various other methods, and a material of the mask may be variously changed.

Figure 16D:
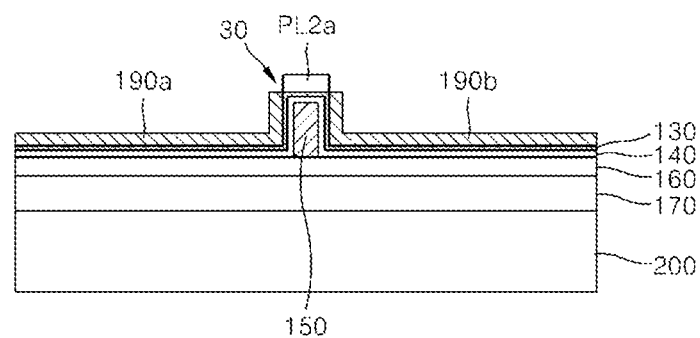
Figure 16E:
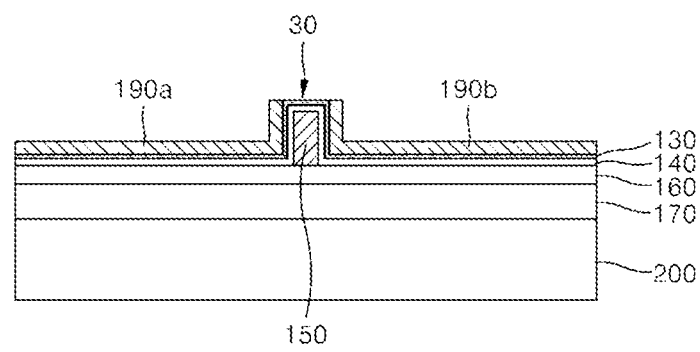

Referring to FIG. 16D, a first conductive layer 190a and a second conductive layer 190b may be formed on the channel layer 130 at both sides of the 3D channel region 30 by using the portion PL2a of the SAM PL2 attached to the top surface of the 3D channel region 30 as a mask. Next, the portion PL2a of the SAM PL2 may be removed. A resultant structure obtained after removing the portion PL2a of the SAM PL2 is illustrated in FIG. 16E. In FIG. 16E, the first conductive layer 190a and the second conductive layer 190b may respectively correspond to the source electrode S20 and the drain electrode D20 of FIG. 6.

In FIGS. 16A through 16E, a mask (i.e., the portion PL2a of FIG. 16C) may be self-aligned, and the first conductive layer 190a and the second conductive layer 190b may be self-aligned at both sides of the mask (i.e., the portion PL2a of FIG. 16C). Accordingly, misalignment problems may be prevented (or reduced), and operating characteristics of the transistor may be improved.

The transistor of FIG. 7 may be manufactured by modifying the method of FIGS. 14A through 14G and the method of FIGS. 15A through 15E, which will be briefly explained with reference to FIGS. 17A and 17B.

Figure 17A:
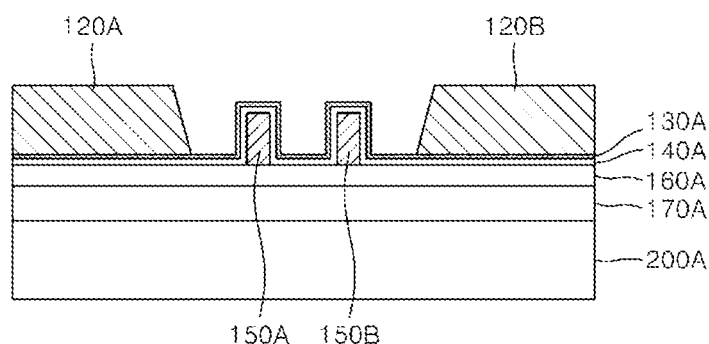
FIGS. 17A and 17B are cross-sectional views illustrating a method of manufacturing a transistor, according to example embodiments.

Referring to FIG. 17A, a structure in which an insertion layer 170A and an insulating layer 160A are sequentially stacked on a second substrate 200A, first and second gates 150A and 150B are formed on the insulating layer 160A, a gate insulating layer 140A and a channel layer 130A are formed to cover the first and second gates 150A and 150B, and a first source electrode portion 120A and a second source electrode portion 120B are provided on the channel layer 130A may be prepared. A method of forming the structure may be similar to the method of FIGS. 14A through 14G.

Figure 17B:
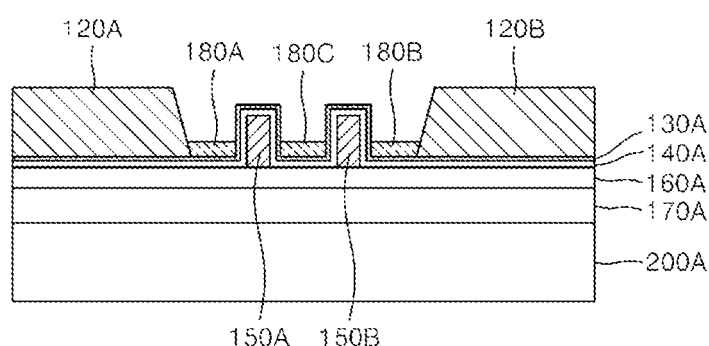

Referring to FIG. 17B, first through third conductive layers 180A, 180B, and 180C may be formed. A method of forming the first through third conductive layers 180A, 180B, and 180C may be similar to a method of forming the second source portion 180A and the second drain portion 180B of FIG. 15E. The first conductive layer 1080A may be disposed on a region of the channel layer 130 between the first source electrode portion 120A and the first gate 150A, the second conductive layer 180B may be disposed on a region of the channel layer 130 between the second source electrode portion 120B and the second gate 150B, and the third conductive layer 180C may be disposed on a region of the channel layer 130 between the first and second gates 150A and 150B. The first conductive layer 180A and the second conductive layer 180B may respectively correspond to the 1-2 source portion S120 and the 2-2 source portion S220 of FIG. 7. The third conductive layer 180C may correspond to the drain electrode D100 of FIG. 7.

FIGS. 18A through 18E are cross-sectional views illustrating a method of manufacturing a transistor according to example embodiments.

Figure 18A:
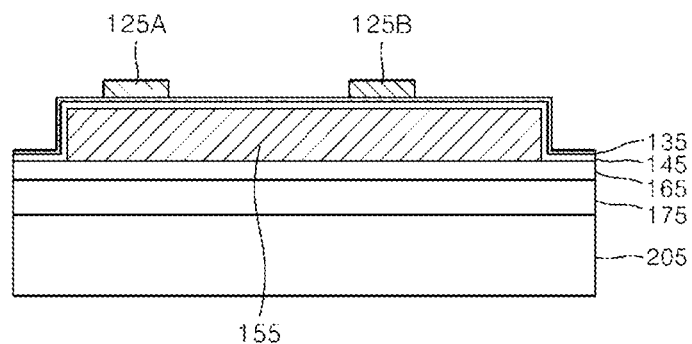
FIGS. 18A through 18E are cross-sectional views illustrating a method of manufacturing a transistor, according to example embodiments.

Referring to FIG. 18A, a structure in which an insertion layer 175 and an insulating layer 165 are sequentially stacked on a second substrate 205, a bottom gate 155 is formed on the insulating layer 165, forming a first gate insulating layer 145 and a channel layer 135 are formed to cover the bottom gate 155, and a source electrode 125A and a drain electrode 125B are provided on the channel layer 135 may be prepared. A method of forming the structure may be similar to the method of FIGS. 14A through 14G. The source electrode 125A and the drain electrode 125B may be formed from a mold layer that corresponds to the mold layer 120 of FIG. 14F. Alternatively, the source electrode 125A and the drain electrode 125B may be formed from an additional conductive layer instead of the mold layer.

Figure 18B:
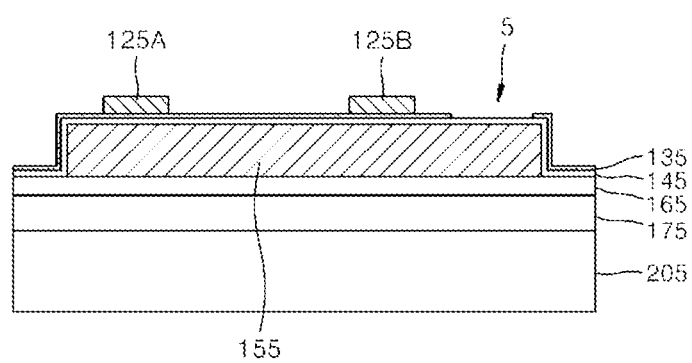

Referring to FIG. 18B, an opening 5 exposing a portion of the first gate insulating layer 145 may be formed by removing a portion of the channel layer 135. The opening 5 may be formed over the bottom gate 155 at one side of the drain electrode 125B. The drain electrode 125B may be disposed between the opening 5 and the source electrode 125A.

Figure 18C:
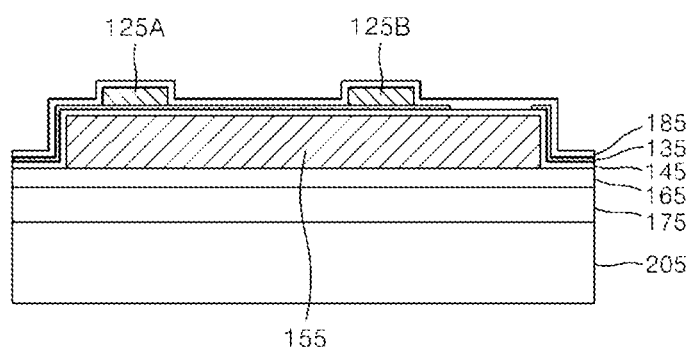

Referring to FIG. 18C, a second gate insulating layer 185 that covers the source electrode 125A and the drain electrode 125B may be formed on the portion of the first gate insulating layer 145 exposed by the opening 5 (see FIG. 18B) and the channel layer 135.

Figure 18D:
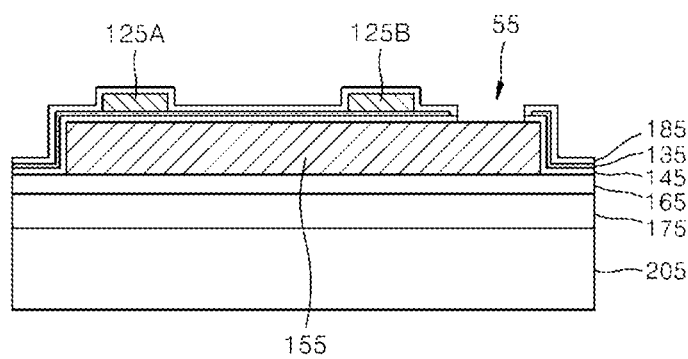

Referring to FIG. 18D, a contact hole 55 exposing a portion of the bottom gate 155 may be formed by partially etching the second gate insulating layer 185 and the first gate insulating layer 145 in the opening 5 (see FIG. 18B). A size (width) of the contact hole 55 may be less than a size (width) of the opening 5 (see FIG. 18B). Accordingly, the channel layer 135 may not be exposed at an inner wall of the contact hole 55.

Figure 18E:
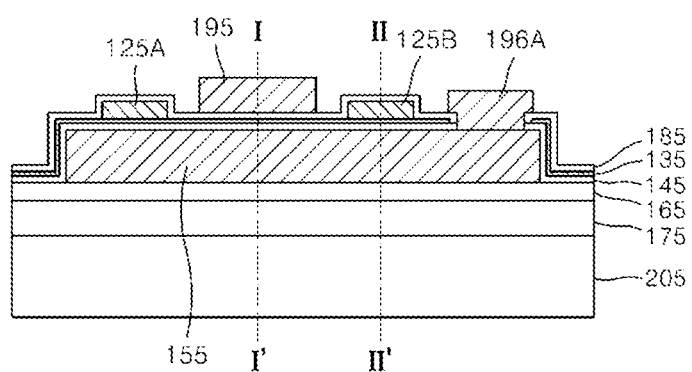

Referring to FIG. 18E, a top gate 195 and a first contact electrode 196A may be formed. The top gate 195 may be formed on the second gate insulating layer 185 between the source electrode 125A and the drain electrode 125B. The first contact electrode 196A may be formed to contact the bottom gate 155 in the contact hole 55 (see FIG. 18D). The first contact electrode 196A may be electrically isolated from the channel layer 135.

Figure 19:
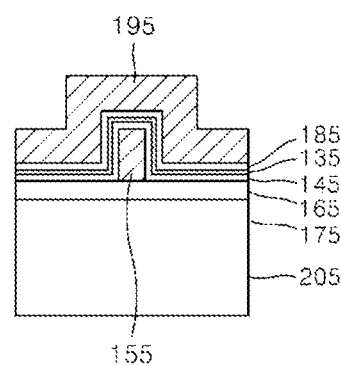
FIG. 19 is a cross-sectional view taken along line I-I' of FIG. 18E.
Figure 20:
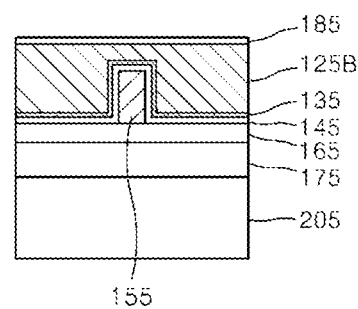
FIG. 20 is a cross-sectional view taken along line II-II' of FIG. 18E.

FIG. 19 is a cross-sectional view taken along line I-I' of FIG. 18E. FIG. 20 is a cross-sectional view taken along line II-II' of FIG. 18E.

Structures of FIGS. 19 and 20 may be similar to structures of FIGS. 9B and 9C. The transistor of FIGS. 18E, 19, and 20 may have a planar structure like that in FIG. 10.

FIGS. 21A through 21G are cross-sectional views illustrating a method of manufacturing a transistor according to example embodiment.

Each of FIGS. 21A through 21G includes drawings (A) and (B). Drawing (B) is a cross-sectional view taken along line I-I' of drawing (A).

Figure 21A:
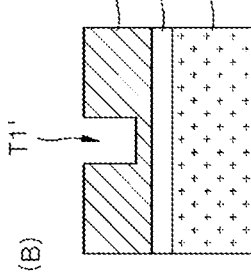
Figure 21A:
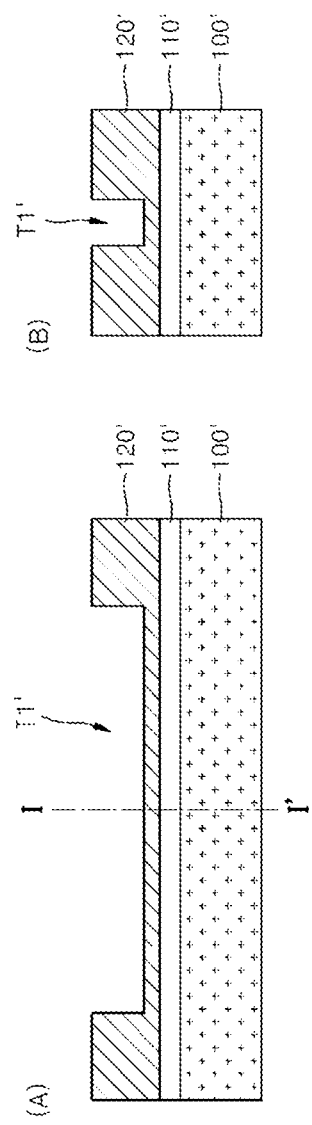

Referring to FIG. 21A, a mold layer 120' including a trench T1' may be formed on a first substrate 100'. Before the mold layer 120' is formed, an intermediate layer 110' may be formed on the first substrate 100' and then the mold layer 120' may be formed on the intermediate layer 110'. The intermediate layer 110' may be an insulating layer. For example, the intermediate layer 110' may be an oxide layer such as a silicon oxide layer, or a nitride layer. The mold layer 120' may be formed of a catalyst material for forming graphene. In this regard, the mold layer 120' may be a catalyst layer. For example, the mold layer 120' may be formed of at least one of a metal (e.g., Ni, Cu, Co, Pt, or Ru) and a combination thereof. However, a material of the mold layer 120' is not limited thereto and may be variously changed.

Figure 21B:
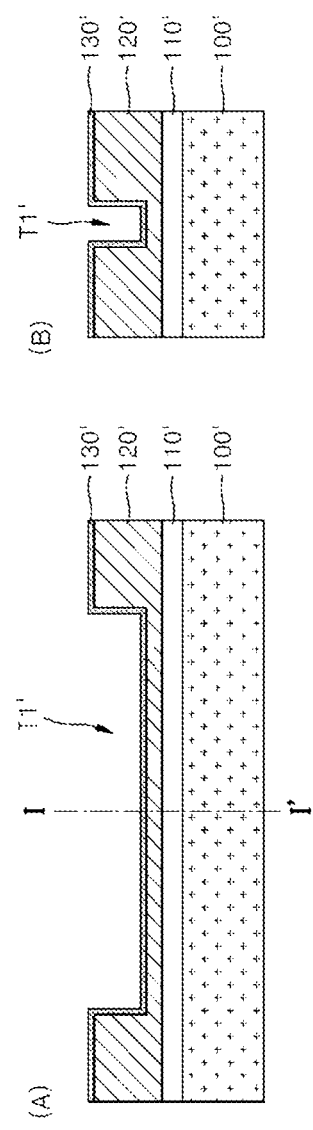

Referring to FIG. 21B, a channel layer 130' may be formed on the mold layer 120'. The channel layer 130' may be conformably formed on a top surface of the mold layer 120'. The channel layer 130' may have a 3D structure due to the trench T1. A material of the channel layer 130' may be graphene. In this case, the mold layer 120' may be used as a catalyst layer for growing graphene.

Figure 21C:
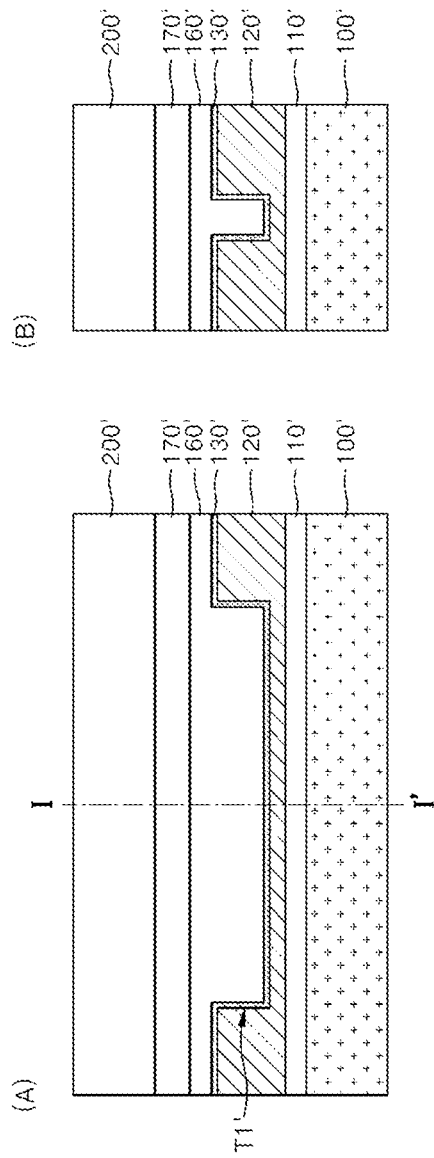

Referring to FIG. 21C, an insulating layer 160' filling the trench T1' may be formed on the channel layer 130'. The insulating layer 160' may be formed so as to fill the trench T1' and to cover an entire surface of the channel layer 130'. A top surface of the insulating layer 160' may be flat or not. The insulating layer 160' may be formed of an oxide, a nitride, or an oxynitride. An insertion layer 170' may be further formed on the insulating layer 160'. The insertion layer 170' may be formed of an insulating material (e.g., a polymer) or an SOG material. The insertion layer 170' may be formed by using, for example, spin coating. The insertion layer 170' is optional. Next, a second substrate 200' may be attached to the insertion layer 170'. The second substrate 200' may be, for example, a polymer substrate, a glass substrate, or a silicon substrate. A material of the second substrate 200' is not limited thereto and may be variously changed.

Figure 21D:
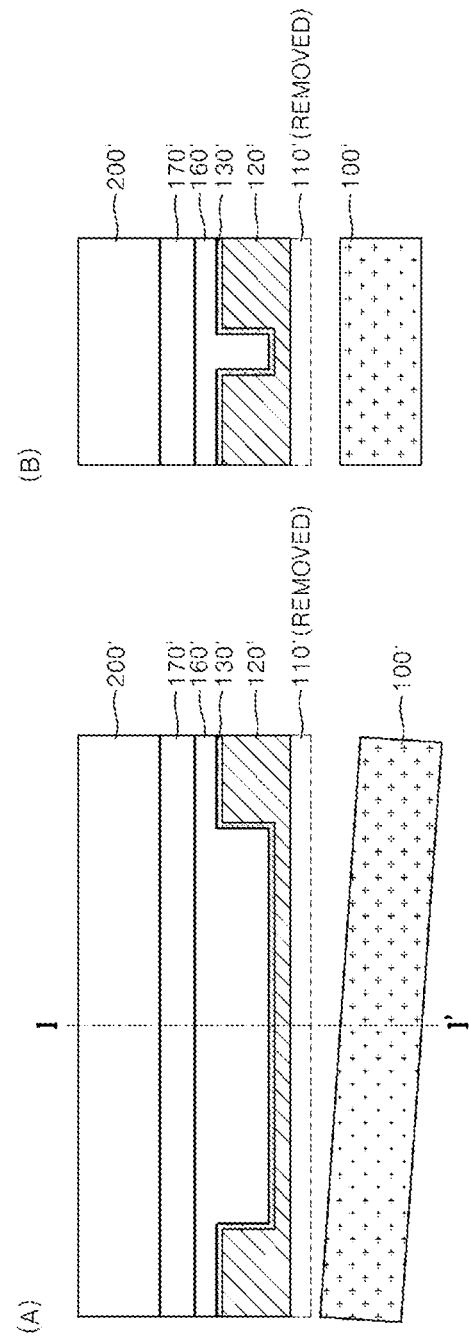

Referring to FIG. 21D, the first substrate 100' may be removed or separated. For example, the first substrate 100' may be removed or separated by etching the intermediate layer 110'.

Referring to FIG. 21E, the second substrate 200' on which the mold layer 120', the channel layer 130', and the insulating layer 160' are formed may be overturned.

Referring to FIG. 21F, a source electrode 120a' and a drain electrode 120b' may be formed by patterning the mold layer 120'. Because the mold layer 120' may be a conductive layer (e.g., a metal layer), the source electrode 120a' and the drain electrode 120b' may be formed from the mold layer 120'.

Referring to FIG. 21G, a gate insulating layer 180' that covers the channel layer 130', the source electrode 120a', and the drain electrode 120b' may be formed. A gate 190' may be formed on the gate insulating layer 180'. The gate 190' may be formed between the source electrode 120a' and the drain electrode 120b'. The transistor manufactured by using the method of FIGS. 21A through 21G may correspond to the transistor described with reference to FIGS. 12A and 12B.

According to example embodiments, a device layer including a plurality of device regions may be formed on a first substrate, the plurality of device regions may be separated by patterning the device layer, a second substrate may be attached, and the first substrate may be removed. These example embodiments will be described in detail with reference to FIGS. 22A through 22E.

Figure 22A:
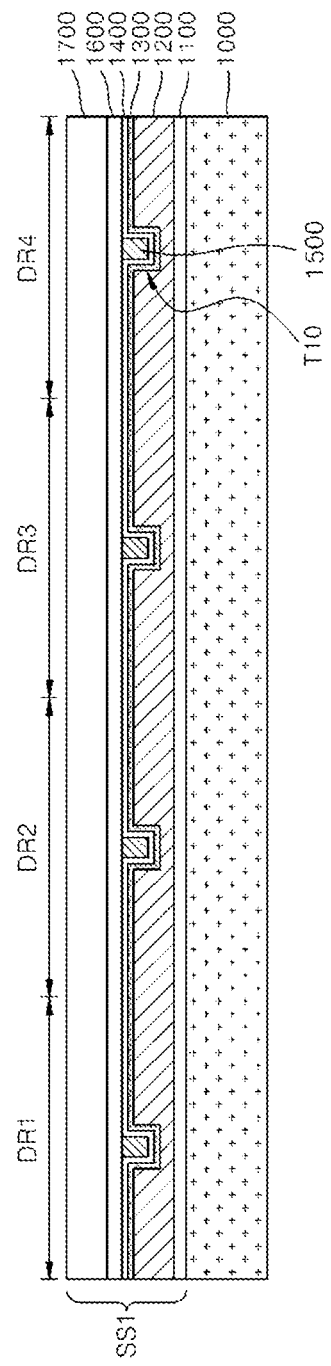

Referring to FIG. 22A, a stacked structure SS1 having a plurality of device regions DR1 through DR4 may be formed on a first substrate 1000. The stacked structure SS1 may include an intermediate layer 1100, a mold layer 1200, a channel layer 1300, a gate insulating layer 1400, gates 1500, an insulating layer 1600, and an insertion layer 1700. A plurality of trenches T10 may be formed in the mold layer 1200, and the channel layer 1300 may have a 3D structure due to the trenches T10. The gates 1500 may be respectively disposed in the trenches T10. Each of the device regions DR1 through DR4 may have one trench T10 and one gate 1500 corresponding to the trench T10. The plurality of device regions DR1 through DR4 may be connected to one another.

Referring to FIG. 22B, the plurality of device regions DR1 through DR4 may be separated by patterning the stacked structure SS1. The patterning may be performed until a top surface of the first substrate 1000 is exposed by performing etching on the stacked structure SS1 from the insertion layer 1700 to the intermediate layer 1100. By the patterning, division trenches DT10 may be formed between the plurality of device regions DR1 through DR4. The division trenches DT10 may be gaps. When being seen from above, the device regions DR1 through DR4 separated from one another by the patterning may be regularly arranged in a plurality of rows and columns. When being seen from above, the division trenches DT10 formed between the plurality of device regions DR1 through DR4 may have a structure similar to a mesh structure. In this regard, the patterning may be referred to as mesh patterning.

Figure 22C:
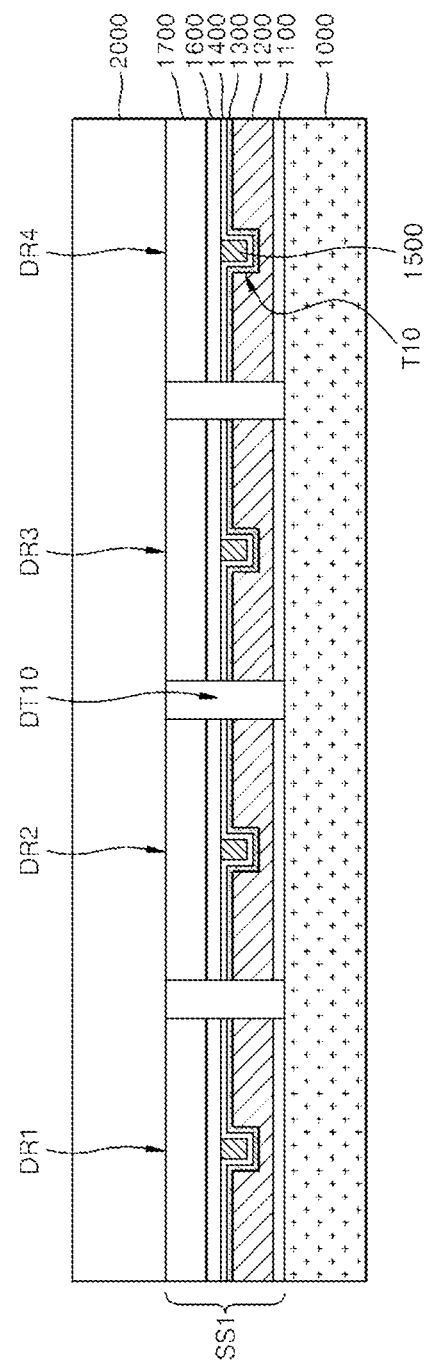

Referring to FIG. 22C, a second substrate 2000 may be attached to the stacked structure SS1 having the plurality of device regions DR1 through DR4 that are separated from one another. The second substrate 2000 may support the plurality of device regions DR1 through DR4. The second substrate 2000 may be formed of a material equal or similar to a material of the second substrate 200 of FIG. 14D.

Referring to FIG. 22D, etching may be performed on the intermediate layer 1100 by injecting an etchant (not shown) through the division trenches DT10 between the plurality of device regions DR1 through DR4. Because the etchant may be injected between the plurality of device regions DR1 through DR4, the intermediate layer 1100 may be easily etched. Although the first substrate 1000 is a large-size substrate, the intermediate layer 1100 may be easily removed in a short period. Accordingly, the first substrate 1000 may be easily removed or separated. Because the intermediate layer 1100 is etched in order to remove the first substrate 1000, the intermediate layer 1100 may act as a sacrificial layer. If the first substrate 1000 is removed by etching the mold layer 1200 instead of the intermediate layer 1100, the mold layer 1200 may be referred to as a sacrificial layer.

A resultant structure obtained after removing or separating the first substrate 1000 in FIG. 22D may be as FIG. 22E. In FIG. 22E, the device regions DR1 through DR4 may each have a structure which is the same as that of FIG. 14F. Although not shown in FIG. 22D, a subsequent process may be performed on the structure of FIG. 22E. The subsequent process may be similar to a process of FIG. 14G or the method of FIGS. 15A through 15E.

The method of FIGS. 22A through 22E may be similarly applied to the method of FIGS. 16A through 16E, the method of FIGS. 17A and 17B, the method of FIGS. 18A through 18E, and the method of FIGS. 21A through 21G as well as the method of FIGS. 14A through 14G and the method of FIGS. 15A through 15E.

When the method illustrated in FIGS. 22A through 22E is used, the method of manufacturing a transistor according to example embodiments may be easily applied to a large-size substrate having a diameter of equal to, or greater than, 300 mm. Thus, according to example embodiments, productivity of transistors may be improved and the manufacturing costs thereof may be reduced.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A transistor, comprising:
 a gate on a substrate;
 a channel layer having a three-dimensional (3D) channel region partially covering both side surfaces and a top surface of the gate;
 a source electrode contacting a first region of the channel layer,
 wherein the source electrode includes,
   a first source electrode portion, an upper surface of the first source electrode portion being higher than an upper surface of the 3D channel region,
   a second source electrode portion between the first source electrode portion and the 3D channel region,
   bottom surfaces of the first and second source electrode portions directly contact an upper surface of the channel layer, and
   a thickness of the first source electrode portion being greater than a thickness of the second source electrode portion; and
 a drain electrode contacting a second region of the channel layer.

2. The transistor of claim 1, wherein the channel layer is on the substrate.

3. The transistor of claim 1, wherein the channel layer includes graphene.

4. The transistor of claim 1, wherein the source electrode and the drain electrode are respectively at sides of the gate.

5. The transistor of claim 4, wherein the first source electrode portion is spaced apart from a first side of the 3D channel region, and
 the drain electrode includes a first drain electrode portion spaced apart from a second side of the 3D channel region.

6. The transistor of claim 5, wherein an upper surface of the first drain electrode portion is higher than the upper surface of the 3D channel region.

7. The transistor of claim 5, wherein
the drain electrode further includes a second drain electrode portion between the first drain electrode portion and the 3D channel region.

8. The transistor of claim 7, wherein the upper surface of second source electrode portion and an upper surface of the second drain electrode portion are even with, or lower, than the upper surface of the 3D channel region.

9. The transistor of claim 7, wherein an effective channel length of the transistor is adjusted according to a height of each of the second source electrode portion and the second drain electrode portion.

10. The transistor of claim 1, wherein,
the source electrode includes,
the first source electrode portion on the channel layer at one side of the gate, and
the second source electrode portion connected to the first source electrode portion, the second source electrode portion being on a first side wall of the gate, and
the drain electrode includes,
a first drain electrode portion on the channel layer at another side of the gate, and
a second drain electrode portion connected to the first drain electrode portion, the second drain electrode portion being on a second side wall of the gate.

11. The transistor of claim 1, wherein the gate includes a first gate and a second gate spaced apart from each other in a horizontal direction,
the source electrode includes a first source electrode and a second source electrode spaced apart from each other with the first and second gates therebetween, and
the drain electrode is between the first and second gates.

12. The transistor of claim 11, wherein the first source electrode includes a first primary source electrode portion at one side of the first and second gates,
the second source electrode includes a second primary source electrode portion at another side of the first and second gates, and
the first and second primary source electrode portions collectively forming the first source electrode portion.

13. The transistor of claim 12, wherein the first source electrode further includes a first secondary source electrode portion between the first primary source electrode portion and the first gate, and
the second source electrode further includes a second secondary source electrode portion between the second primary source electrode portion and the second gate.

14. The transistor of claim 13, wherein the first secondary source electrode portion and the second secondary source electrode portion each have a height less than a height of each of the first primary source electrode portion and the second primary source electrode portion.

15. The transistor of claim 13, wherein the drain electrode has a height equal to a height of each of the first secondary source electrode portion and the second secondary source electrode portion.

16. The transistor of claim 1, further comprising:
an insulating layer on the substrate, the gate being on the insulating layer,
wherein the channel layer is on the insulating layer so as to cover at least a portion of the gate.

17. The transistor of claim 1, wherein the substrate is one selected from a polymer substrate, a glass substrate and a silicon substrate.

18. A method of manufacturing a transistor, the method comprising:
forming a stacked structure including a gate and a channel layer having a three-dimensional (3D) channel region partially covering both side surfaces and a top surface of the gate;
forming a source electrode contacting a first region of the channel layer,
wherein the forming a source electrode includes,
forming a first source electrode portion, an upper surface of the first source electrode portion being higher than an upper surface of the 3D channel region,
forming a second source electrode portion between the first source electrode portion and the 3D channel region,
bottom surfaces of the first and second source electrode portions directly contacting an upper surface of the channel layer, and
a thickness of the first source electrode portion being greater than a thickness of the second source electrode portion; and
forming a drain electrode contacting a second region of the channel layer.

19. The method of claim 18, wherein the channel layer includes graphene.

20. The method of claim 18, wherein the forming of the stacked structure includes,
forming a mold layer on a first substrate, the mold layer including a trench;
forming the channel layer on the mold layer, the channel layer having a 3D structure due to the trench;
forming a gate insulating layer on the channel layer; and
forming a gate in the trench.

21. The method of claim 20, wherein the forming of the stacked structure further includes,
attaching a second substrate to the gate and the gate insulating layer; and
removing the first substrate.

22. The method of claim 21, wherein the forming of the stacked structure includes forming a plurality of device regions,
the forming of the mold layer includes forming a plurality of trenches respectively corresponding to the plurality of device regions, and
the gate is formed in each of the plurality of trenches.

23. The method of claim 22, further comprising:
separating the plurality of device regions by patterning the stacked structure.

24. The method of claim 23, further comprising:
forming a sacrificial layer between the first substrate and the stacked structure,
wherein the removing of the first substrate includes etching the sacrificial layer by injecting an etchant between the plurality of device regions.

25. The method of claim 20, wherein the channel layer includes graphene.

26. The method of claim 25, wherein the mold layer is a catalyst layer, and
the graphene is formed from the catalyst layer.

27. The method of claim 20, wherein at least a portion of each of the source electrode and the drain electrode is formed from the mold layer.

28. The method of claim 27, wherein the forming of the source electrode and the drain electrode includes patterning the mold layer.

29. The method of claim 20, wherein the forming of the source electrode includes forming the first source electrode portion at one side of the 3D channel region, and the forming of the drain electrode includes forming a first drain electrode portion at another side of the 3D channel region.

30. The method of claim 29, wherein the forming of the drain electrode further includes forming a second drain electrode portion between the first drain electrode portion and the 3D channel region.

31. The method of claim 30, wherein the forming of the second source electrode portion and the second drain electrode portion includes, forming a mask pattern on the first source electrode portion, the first drain electrode portion, and the 3D channel region;

forming a plurality of conductive layers between the first source electrode portion and the 3D channel region and between the first drain electrode portion and the 3D channel region, and removing the mask pattern.

32. The method of claim 31, wherein the forming of the mask pattern includes using backside exposure.

33. The method of claim 18, wherein the gate includes a first gate and a second gate spaced apart from each other in a horizontal direction, the source electrode includes a first source electrode and a second source electrode spaced apart from each other with the first and second gates therebetween, and the drain electrode is formed between the first and second gates.

34. A method of manufacturing a transistor, the method comprising:

forming a mold layer on a first substrate, the mold layer including a trench;

forming a channel layer on at least a portion of the mold layer, the channel layer having a three-dimensional (3D) structure due to the trench;

forming an insulating layer on the channel layer, the insulating layer filling the trench;

attaching a second substrate to the insulating layer;

removing the first substrate;

forming a source electrode and a drain electrode respectively contacting a first region and a second region of the channel layer, wherein the forming a source electrode includes, forming a first source electrode portion, an upper surface of the first source electrode portion being higher than an upper surface of the 3D channel structure, forming a second source electrode portion between the first source electrode portion and the 3D channel structure, bottom surfaces of the first and second source electrode portions directly contacting an upper surface of the channel layer, and a thickness of the first source electrode portion being greater than a thickness of the second source electrode portion; and forming a gate between the source electrode and the drain electrode, the gate being insulated from the channel layer, and the channel layer partially covering both side surfaces and a top surface of the gate.

35. The method of claim 34, wherein the channel layer covers at least side walls and a bottom surface of the trench.

36. The method of claim 34, further comprising:

forming a gate insulating layer on the channel layer prior to the forming of the gate.

37. The method of claim 34, wherein the channel layer includes graphene.

38. The method of claim 37, wherein the forming of the mold layer includes using a catalyst material, and the graphene is formed from the catalyst material.

39. The method of claim 34, further comprising:

forming a sacrificial layer between the first substrate and the mold layer, wherein the removing of the first substrate includes etching the sacrificial layer.

40. The method of claim 34, wherein at least a portion of each of the source electrode and the drain electrode is formed from the mold layer.

41. The method of claim 34, wherein the gate has a 3D structure in a region of the channel layer.

* * * * *